(12) United States Patent
Mohammadpour et al.

(10) Patent No.: US 9,882,543 B2
(45) Date of Patent: Jan. 30, 2018

(54) MAGNETIC STRUCTURES FOR FILTERING AMPLIFIER OUTPUTS

(71) Applicant: Bose Corporation, Framingham, MA (US)

(72) Inventors: Ali Mohammadpour, Framingham, MA (US); Michael B. Nussbaum, Newton Upper Falls, MA (US); Remco Terwal, West Newton, MA (US)

(73) Assignee: Bose Corporation, Framingham, MA (US)

( * ) Notice: Subject to any disclaimer, the term of this patent is extended or adjusted under 35 U.S.C. 154(b) by 243 days.

(21) Appl. No.: 14/706,683

(22) Filed: May 7, 2015

(65) Prior Publication Data
US 2016/0329874 A1    Nov. 10, 2016

(51) Int. Cl.
| | | |
|---|---|---|
| *H03H 7/09* | (2006.01) | |
| *H01F 27/24* | (2006.01) | |
| *H03H 7/01* | (2006.01) | |
| *H01F 37/00* | (2006.01) | |
| *H03F 1/56* | (2006.01) | |
| *H03F 3/19* | (2006.01) | |

(Continued)

(52) U.S. Cl.
CPC .............. *H03H 7/09* (2013.01); *H01F 27/24* (2013.01); *H01F 37/00* (2013.01); *H03F 1/565* (2013.01); *H03F 3/19* (2013.01); *H03F 3/21* (2013.01); *H03F 3/217* (2013.01); *H03H 1/0007* (2013.01); *H03H 7/0115* (2013.01); *H03F 2200/171* (2013.01); *H03F 2200/451* (2013.01); *H03H 2001/0035* (2013.01); *H03H 2001/0092* (2013.01)

(58) Field of Classification Search
CPC ........ H03H 7/427; H03H 7/0115; H03H 7/09; H03H 1/0007; H03H 2001/0092; H03H 2200/171; H03H 2001/0035; H01F 37/00; H01F 27/24
USPC ........ 333/4, 5, 175, 185; 336/131, 165, 218, 336/184
See application file for complete search history.

(56) References Cited

U.S. PATENT DOCUMENTS

| | | | | |
|---|---|---|---|---|
| 3,609,615 | A | * | 9/1971 | Parker ................... H01F 17/043 336/178 |
| 2003/0067349 | A1 | * | 4/2003 | Muramatsu ........... H03F 3/2173 330/10 |
| 2009/0237193 | A1 | * | 9/2009 | Wedley .................... H01F 3/10 336/83 |

FOREIGN PATENT DOCUMENTS

| | | |
|---|---|---|
| EP | 2 104 114 | 9/2009 |
| WO | WO 2008/097758 | 8/2008 |

OTHER PUBLICATIONS

Hegarty; "Benefits of multiphasing buck converters—Part 1"; EE Times; Posted on Nov. 17, 2007.

(Continued)

*Primary Examiner* — Rakesh Patel
(74) *Attorney, Agent, or Firm* — Fish & Richardson P.C.

(57) ABSTRACT

The technology described in this document can be embodied in an apparatus that includes at least four magnetic cores, wherein each core is for supporting an inductor of a filter circuit. Each of the cores include a first section, and a second section separated from the first section by an adhesive layer. The apparatus also includes an air-core structure to store magnetic energy, the air-core structure including a set of focusing projections that define a hollow cavity. The individual focusing projections of the set are disposed on different sides of the hollow cavity to focus magnetic field (Continued)

from the at least four magnetic cores through the hollow cavity.

23 Claims, 22 Drawing Sheets

(51) Int. Cl.
    *H03F 3/21*     (2006.01)
    *H03F 3/217*    (2006.01)
    *H03H 1/00*     (2006.01)

(56) References Cited

OTHER PUBLICATIONS

International Search Report and Written Opinion; PCT/US2016/030975; dated Sep. 5, 2016; 13 pages.

* cited by examiner

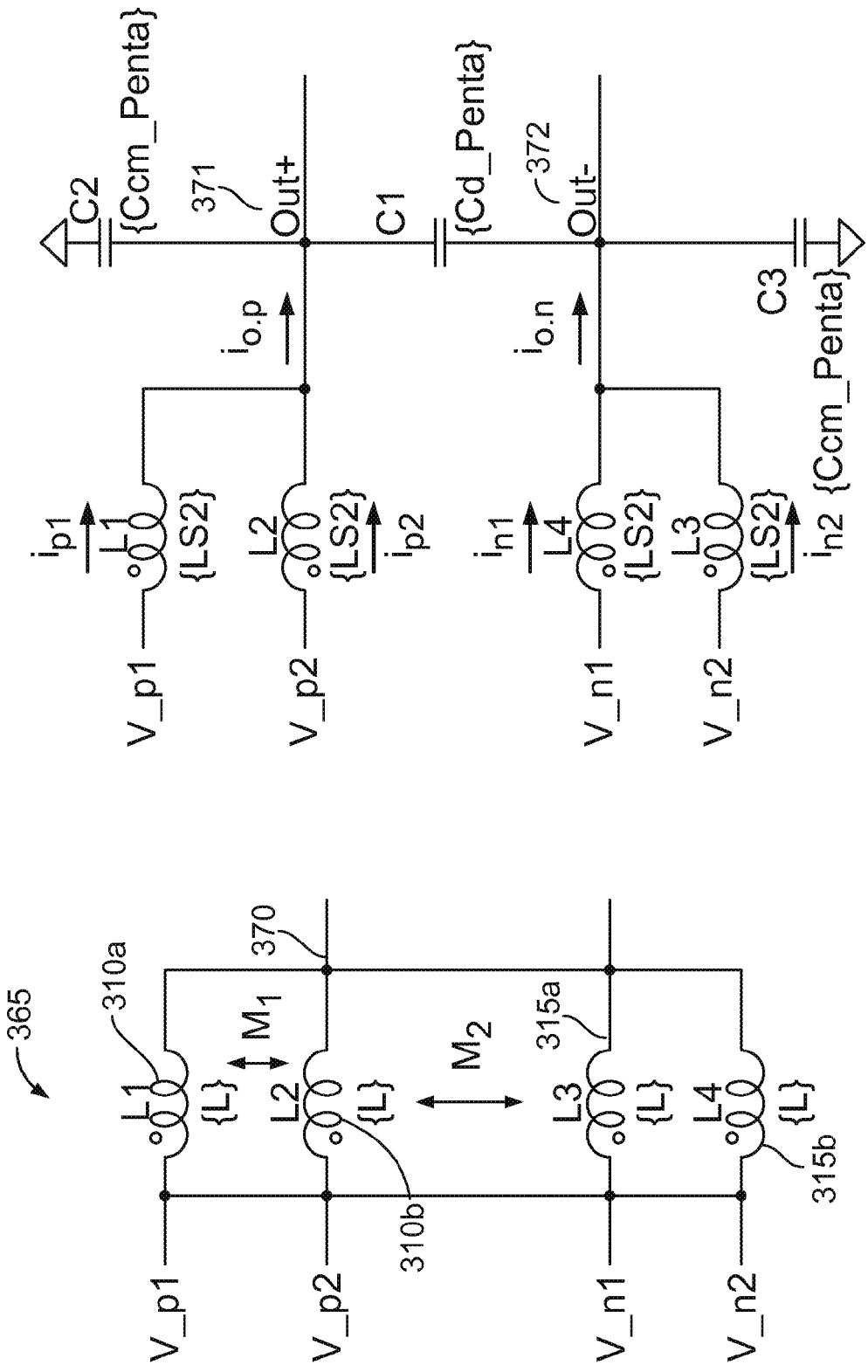

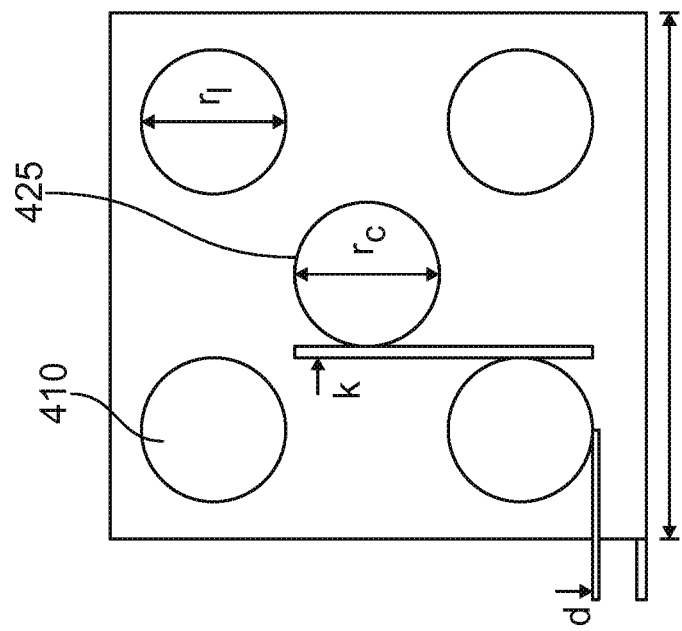
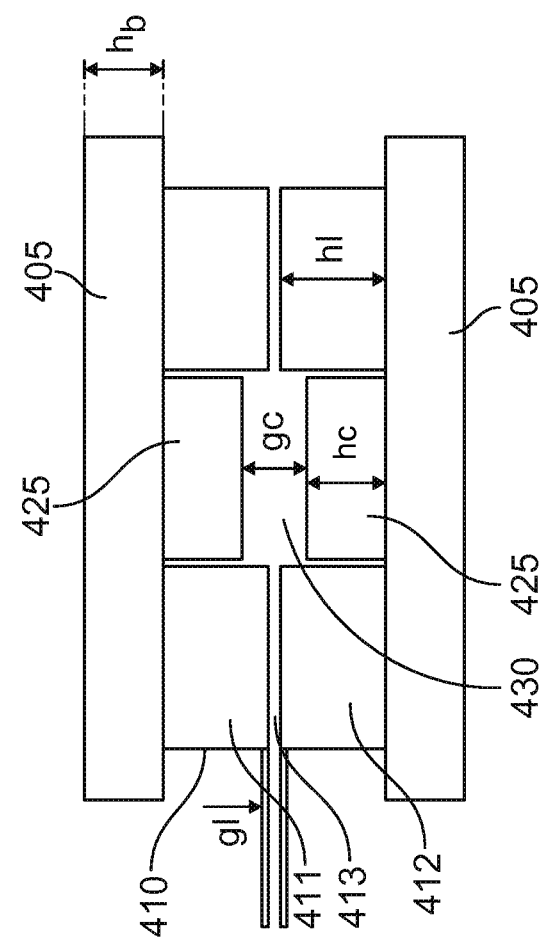
FIG. 4C
FIG. 4B

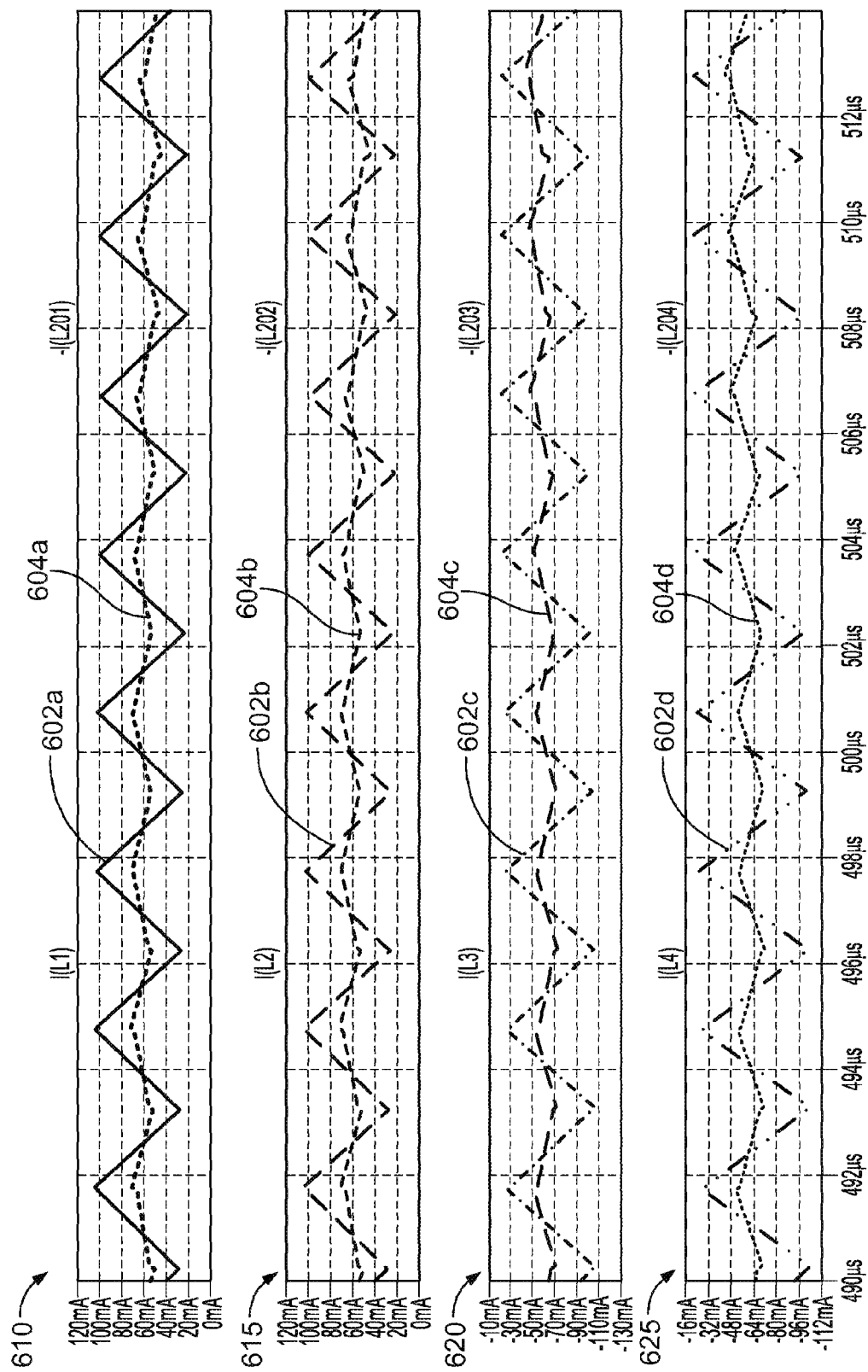

MAGNETIC STRUCTURES FOR FILTERING AMPLIFIER OUTPUTS

TECHNICAL FIELD

This disclosure generally relates to filtering amplifier outputs.

BACKGROUND

Converter circuits (such as H bridges and buck converters) can be used in amplifiers that produce controlled outputs from given supply voltages. Switching operation in individual converter circuits give rise to undesirable ripple currents and voltages. The ripple currents can be reduced via filter circuits (e.g., LC filter circuits) disposed between the amplifiers and the load. Higher switching frequencies result in lower ripple currents, thereby requiring smaller inductors and capacitors in the filter circuits. However, the switching losses increase at higher frequencies, thereby reducing the efficiency of the circuit.

SUMMARY

In one aspect, this document describes an apparatus that includes at least four magnetic cores, wherein each core is to support an inductor. Each of the cores include a first section, and a second section separated from the first section by an adhesive layer. The apparatus also includes an air-core structure to store magnetic energy, the air-core structure including a set of focusing projections that define a hollow cavity. The individual focusing projections of the set are disposed on different sides of the hollow cavity to focus magnetic field from the at least four magnetic cores through the hollow cavity.

In another aspect, this document describes a filter circuit that includes at least four inductors that are inductively coupled with one another. Each of the inductors include a conductor wire wound around a core of magnetic material in a clockwise or anticlockwise direction. The direction of winding for at least two inductors is different from the direction of winding of at least two other inductors. The filter circuit also includes a set of focusing projections defining a hollow cavity that stores magnetic energy when subjected to a magnetic flux, and at least four input terminals, each of which is connected to an output of an amplifier corresponding to one of the at least four inductors. The filter circuit further includes at least two output terminals for connecting the filter circuit to a load driven from both sides by the amplifiers corresponding to the at least four inductors.

In another aspect, this document features an apparatus that includes an amplifier circuit, a filter circuit, and a load. The amplifier circuit includes at least four amplifiers. The load is driven by the amplifier circuit from two sides. The filter circuit includes at least four inductors that are inductively coupled with one another, each of the inductors comprising a conductor wire wound around a core of magnetic material in a clockwise or anticlockwise direction. The direction of winding for at least two inductors are different from the direction of winding of at least two other inductors. The filter circuit also includes a set of focusing projections defining a hollow cavity that stores magnetic energy when subjected to a magnetic flux, and at least four input terminals. Each input terminal connects a corresponding one of the at least four inductors to one of the at least four amplifiers. The filter circuit also includes at least two output terminals for connecting the filter circuit to the load.

Implementations of the above aspects can include one or more of the following features.

Each inductor can include a conducting wire wound in a clockwise or anticlockwise direction around a corresponding magnetic core. The direction of winding for at least two inductors can be different from the direction of winding of at least two other inductors. The at least four inductors can be inductively coupled to one another. The at least four magnetic cores can support inductors that form a portion of a filter circuit disposed between an amplifier circuit and a load that is drivable by the amplifier circuit from two sides. The filter circuit can be operable in a common mode and at least one differential mode. The at least four magnetic cores and the air core can be spatially distributed such that magnetic flux in a differential mode from each of the at least four magnetic cores passes through the hollow cavity. The at least four magnetic cores and the air core can be spatially distributed within the apparatus such that in the common mode, a total magnetic flux passing through the hollow cavity is substantially zero. The load can be a bridge-tied load. The amplifier circuit can include at least four buck converters. An output of each buck converter can be connected to a corresponding inductor. The outputs of the at least four buck converters can be interleaved. A cross-sectional area of the hollow cavity and cross-sectional areas of the at least four magnetic cores can be configured such that flux distribution in the apparatus is uniform. The cross-sectional area of the hollow cavity can be substantially equal to sum of the cross-sectional areas of the at least four magnetic cores.

A first set of at least two inductors with a clockwise direction of winding can be connected to one of the output terminals and a second set of at least two inductors with an anticlockwise direction of winding can be connected to another of the output terminals. A common mode inductance of the filter circuit can be at least 1.5 times higher than a differential mode inductance for at least one of the differential modes. The cores supporting the at least four inductors, and the hollow cavity can be disposed within a structure comprising the magnetic material. Individual focusing projections of the set of focusing projections can be disposed on opposite sides of the hollow cavity to focus magnetic field from the at least four magnetic cores through the hollow cavity. Each of the at least four amplifiers can include a buck converter. The load can include a bridge-tied load. The at least two output terminals of the filter circuit are connected to two terminals of the bridge-tied load. The filter circuit can also include six inductors or eight inductors.

Various implementations described herein may provide one or more of the following advantages. An integrated filter structure allows for inductively coupling filter inductors corresponding to four or more synchronous buck converters driving a bidirectional load. For a given size of the filter, higher inductance values for both common mode and differential mode operations can be achieved, which in turn results in lower output ripple currents to the load. Conversely, for a given output ripple current, small and inexpensive filter structures can be produced. Coupling four or more inductors allows for a high common mode inductance that results in a low cut-off frequency in the common mode, and is advantageous in audio applications to minimize RF emissions. Coupling four or more inductors also allows for reduction in relative size of the individual inductors, which more than offsets the small increase in capacitor size to accommodate the energy storage. Using multi-phase converter with interleaving, proper phase shift of switching waveforms between different phases, can be used for high frequency ripple reduction and harmonic cancellation. This is in turn helps reduce filter size and electromagnetic interference (EMI) related problems. The filter elements can be designed as described herein to enhance benefits of interleaving in multi-phase converters.

Two or more of the features described in this disclosure, including those described in this summary section, may be combined to form implementations not specifically described herein.

The details of one or more implementations are set forth in the accompanying drawings and the description below. Other features, objects, and advantages will be apparent from the description and drawings, and from the claims.

DESCRIPTION OF THE DRAWINGS

FIG. 3E illustrates the common mode configuration of the filter circuit of FIG. 3A.

FIG. 3F illustrates examples of various currents flowing in the filter circuit of FIG. 3A.

FIGS. 4B and 4C are lateral and top views, respectively, of the filter structure of FIG. 4A.

FIG. 6A-6D show plots illustrating inductor currents in the circuits depicted in FIGS. 5A and 5B.

DETAILED DESCRIPTION

This document describes a magnetic structure for implementing an inductive-capacitive (LC) filter. The structure can be used, for example, for a filter disposed between an amplifier circuit that includes at least two H-bridges, and a load that is driven from both sides by combinations of the at least four amplifiers. For example, at least two switching amplifiers may be connected to corresponding positive side inductors each of which includes a conductor wound clockwise around a magnetic core of the structure, and at least two other switching amplifiers can be connected to corresponding negative side inductors each of which includes a conductor wound anti-clockwise around a magnetic core of the structure. Outputs of the positive side inductors can be connected together to a positive terminal of a load such as a bridge-tied load. The outputs of the negative side inductors can be connected together to a negative terminal of the load. As described in detail below, the magnetic structure described herein can be designed independently, or in some implementations, to complement an interleaved configuration of the switching amplifiers. The structure can be used for implementing filters with high common mode (CM) and differential mode (DM) inductances, thereby offering optimized design choices for given filter performance criteria.

The magnetic structure described herein can be used for filtering outputs of switching amplifiers. Switching amplifiers are often used in various types of audio applications, including, for example, home theater system speakers, mobile phones, hearing aids, and other powered speakers. Switching amplifiers may also be referred to as class-D amplifiers, and include switching devices (also referred to as active devices) such as transistors. Such modulation techniques include constant amplitude pulse modulation techniques, such as pulse width modulation or pulse density modulation.

Figure 1:
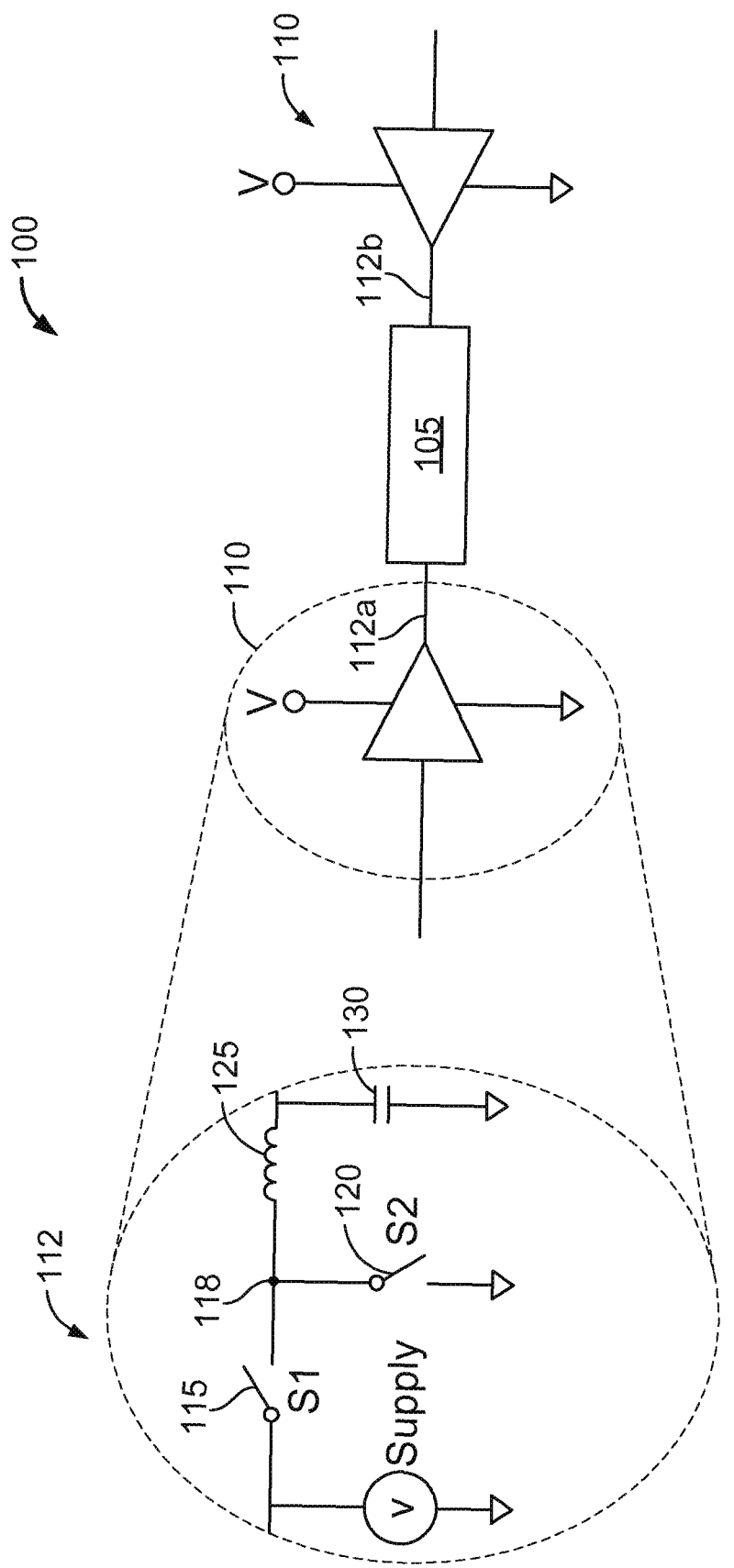
FIG. 1 is a block diagram of a system with an H Bridge and a bridge tied load.

FIG. 1 shows a block diagram of a system 100 where a load 105 (e.g., a speaker) is driven by class-D amplifiers 110 from both sides. FIG. 1 also shows a detailed view 112 of the amplifier 110, the detailed view 112 showing examples of various components that can be used in implementing the amplifier 110. As shown in the detailed view 112, the amplifier 110 includes two switches 115 and 120 which can be implemented using active devices such as transistors. The output generated at the node 118 is a variable duty cycle square wave the low-frequency portion of the spectrum of which includes the desired output, and the high-frequency portion of the spectrum of which includes components due to the switching of the power devices.

The output pulse train obtained at node 118 is converted to an analog signal suitable for driving the load 105 via a low pass filter circuit. In some implementations, the low-pass filter circuit is a passive LC circuit that includes one or more inductors 125 and one or more capacitors 130. While FIG. 1 shows the filter circuit as a part of the detailed view 112 for the amplifier 110, in some cases, the filter circuit may be depicted separately from the amplifier 110. In operation, the filter circuit removes or blocks the high-frequency components and recovers the desired low-frequency signal suitable for driving the load 105. Using purely reactive components such as inductors and capacitors results in high efficiency.

The efficiency of switching amplifiers are affected however by switching losses arising out of the switching operations of the active components 115 and 120. The switching operations also give rise to undesirable ripple currents. The ripple currents can also be reduced by the LC filter circuit. Higher switching frequencies result in lower ripple currents, thereby requiring smaller inductors and capacitors in the LC filter circuits. However, at higher switching frequencies, the switching losses increase, thereby reducing the efficiency of the circuit. In some implementations, the switching frequency can be selected in view of this trade-off. For example, in some applications, the switching frequency can be selected as ten or more times the highest frequency of interest in the input signal.

In the example shown in the detailed view 112, the structure of the class-D amplifier 110 is essentially identical to that of a buck converter. In some implementations, such buck converters can be used as class-D amplifiers for driving a fixed load from both sides. In some implementations, four or more synchronous buck converters configured as two or more H bridges may be used for this purpose. Because the output current and voltage of a class D amplifier can independently change signs, multiple modes of operations are possible in the configuration depicted in FIG. 1. For example, the configuration of FIG. 1 may be operated in a common mode (CM) and one or more differential modes (DM). In a DM, the voltage difference between two load terminals 112a and 112b is given by:

$$V_{dm} = V_1 - V_2$$

wherein $V_1$ and $V_2$ are the output voltages of the amplifiers on the two sides of the load, respectively. The CM voltage is average of the output voltages of two amplifiers, and given by:

$$V_{cm} = \frac{V_1 + V_2}{2}$$

In some implementations, in a DM configuration, the two amplifiers 110 generate substantially equal low frequency audio voltages with opposite signs ($V_1 = V_2$), and current flows from one amplifier to the other through the load and no current (or an insignificant amount of RF switching current) flows to ground. In some implementations, in a CM configuration, the two amplifiers 110 generate substantially the same voltage with same sign ($V_1 = V_2$), and therefore substantially the same current flows out of both amplifiers to the ground. In some implementations, the DM output voltage at the terminals of the load is the quantity of interest, and the one or more amplifiers are used to generate a reference DM voltage at the load terminals. In such cases, the CM component may be an artifact of having the load tied between two amplifier outputs, and consequently it may be desirable to have CM RF currents to be as low as possible.

For a bridge tied load (BTL), where load is connected between two switching bridges, different modulation schemes (e.g., AD, BD) can be used to achieve different goals in terms of DM and CM component of output voltage. In some implementations, higher degrees of freedom can be realized using multiple amplifiers on either side of the load. An example of such a configuration is depicted in FIG. 2, which shows a block diagram of a system 200 where a load 105 is driven by multiple amplifiers 110a, 110b, 110c, and 110d (110, in general) from both sides. Because the duty cycle of the individual amplifiers 110 can be controlled independently, and the outputs of the amplifiers 110 can be interleaved in phase, the configuration of the system 200 provides a high degree of design flexibility.

Figure 2A:
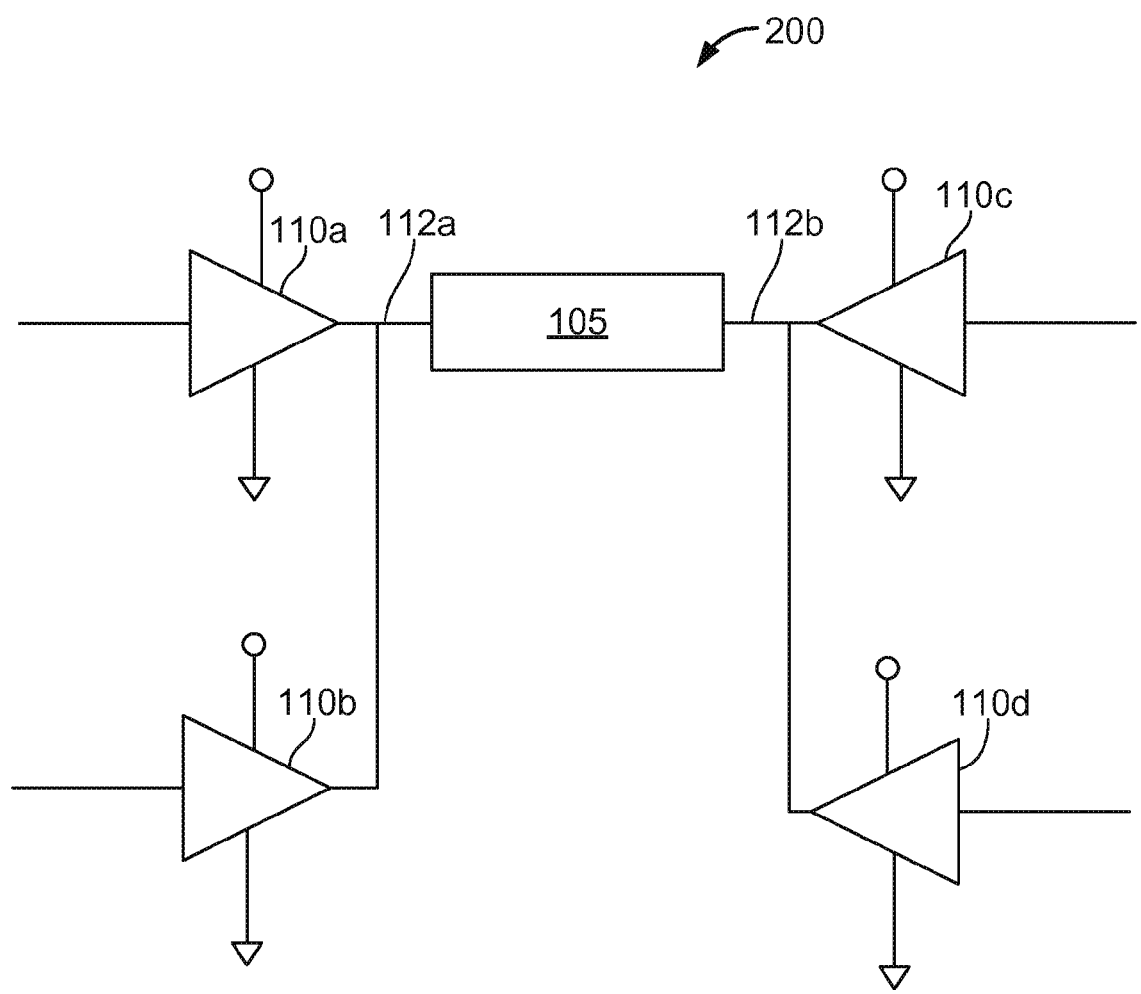
FIG. 2A is a block diagram of a system where a load is driven by multiple H Bridges.
Figure 2B:
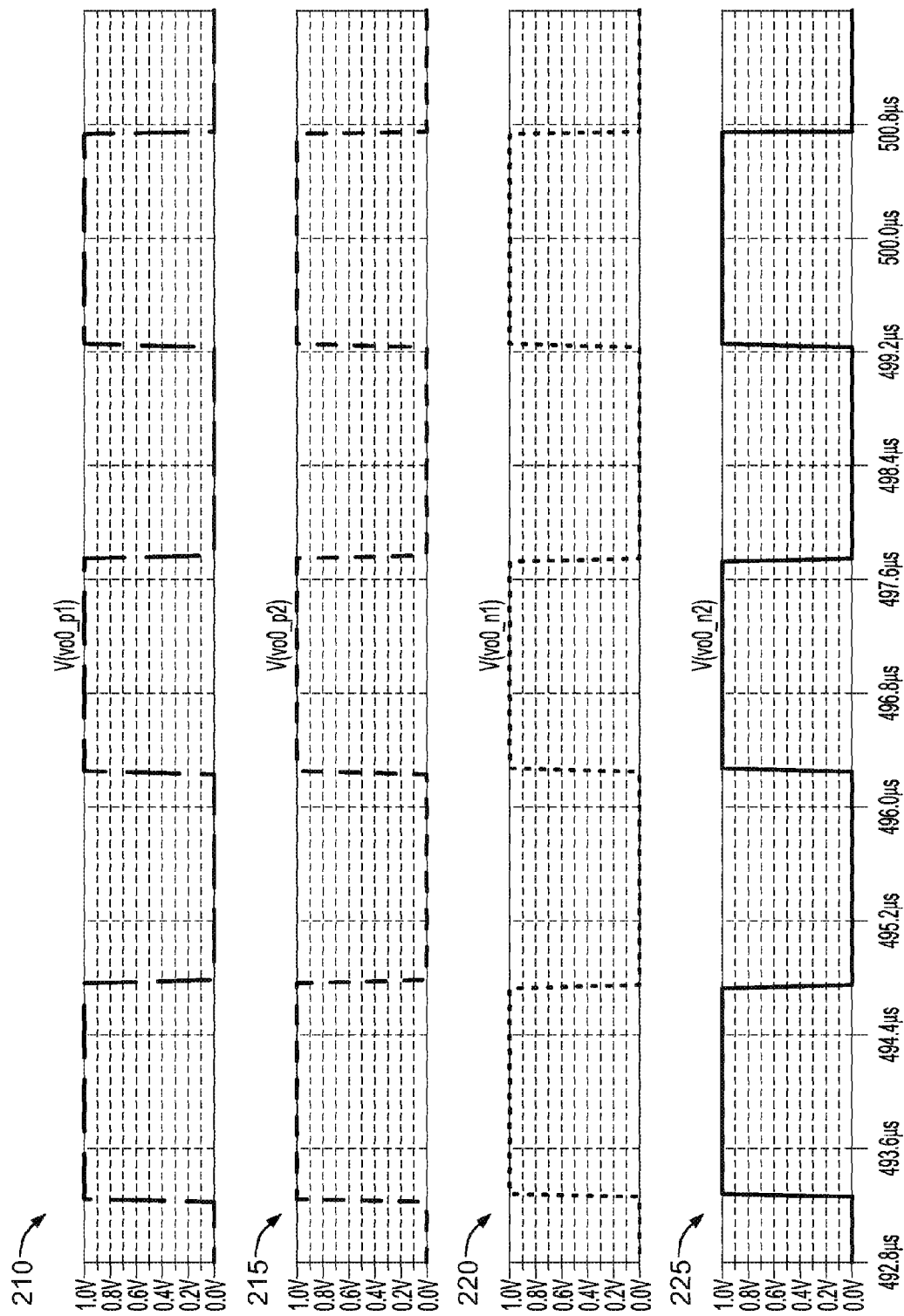
FIG. 2B-2D show various interleaving configurations in the system of FIG. 2A.
Figure 2C:
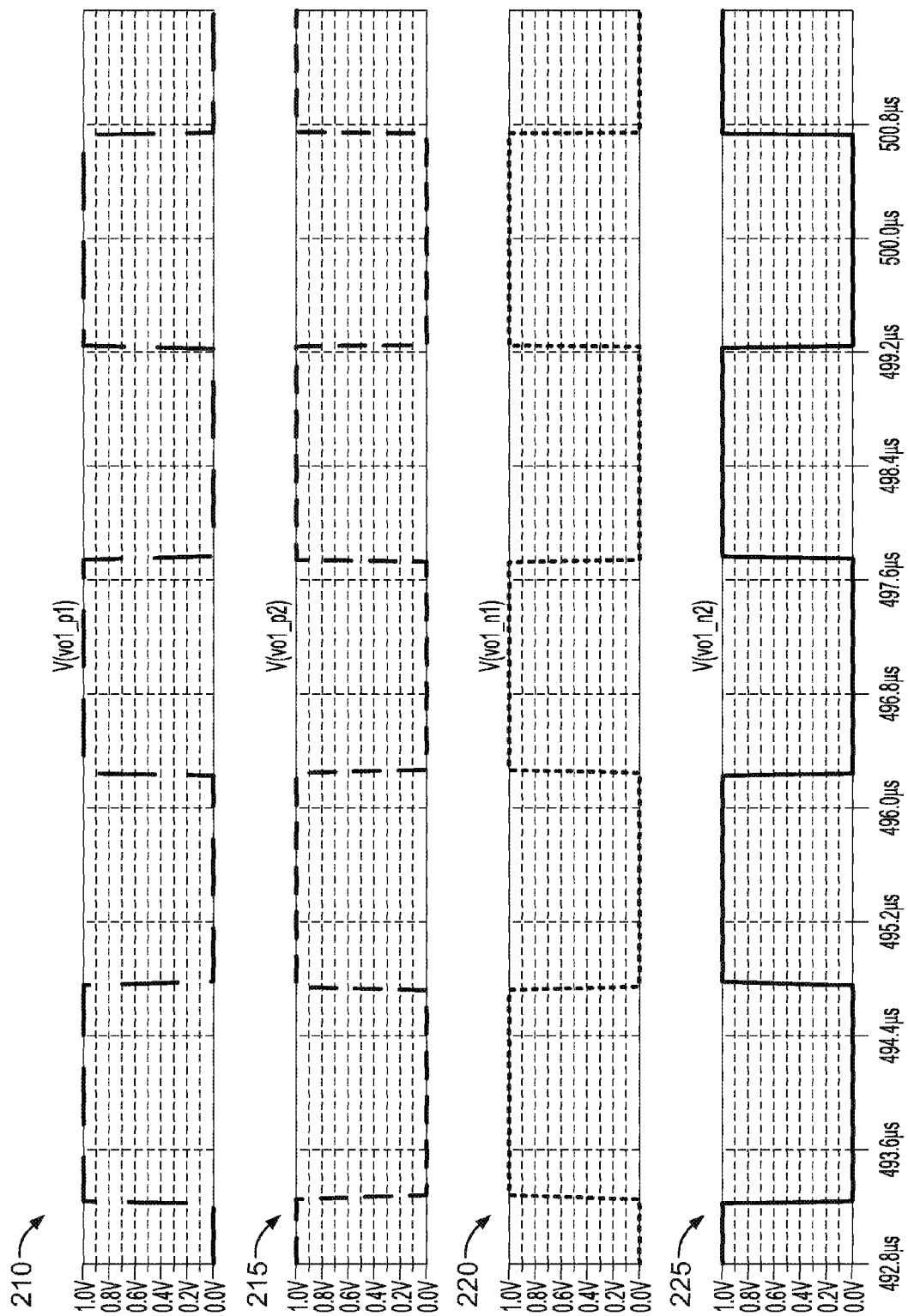
Figure 2D:
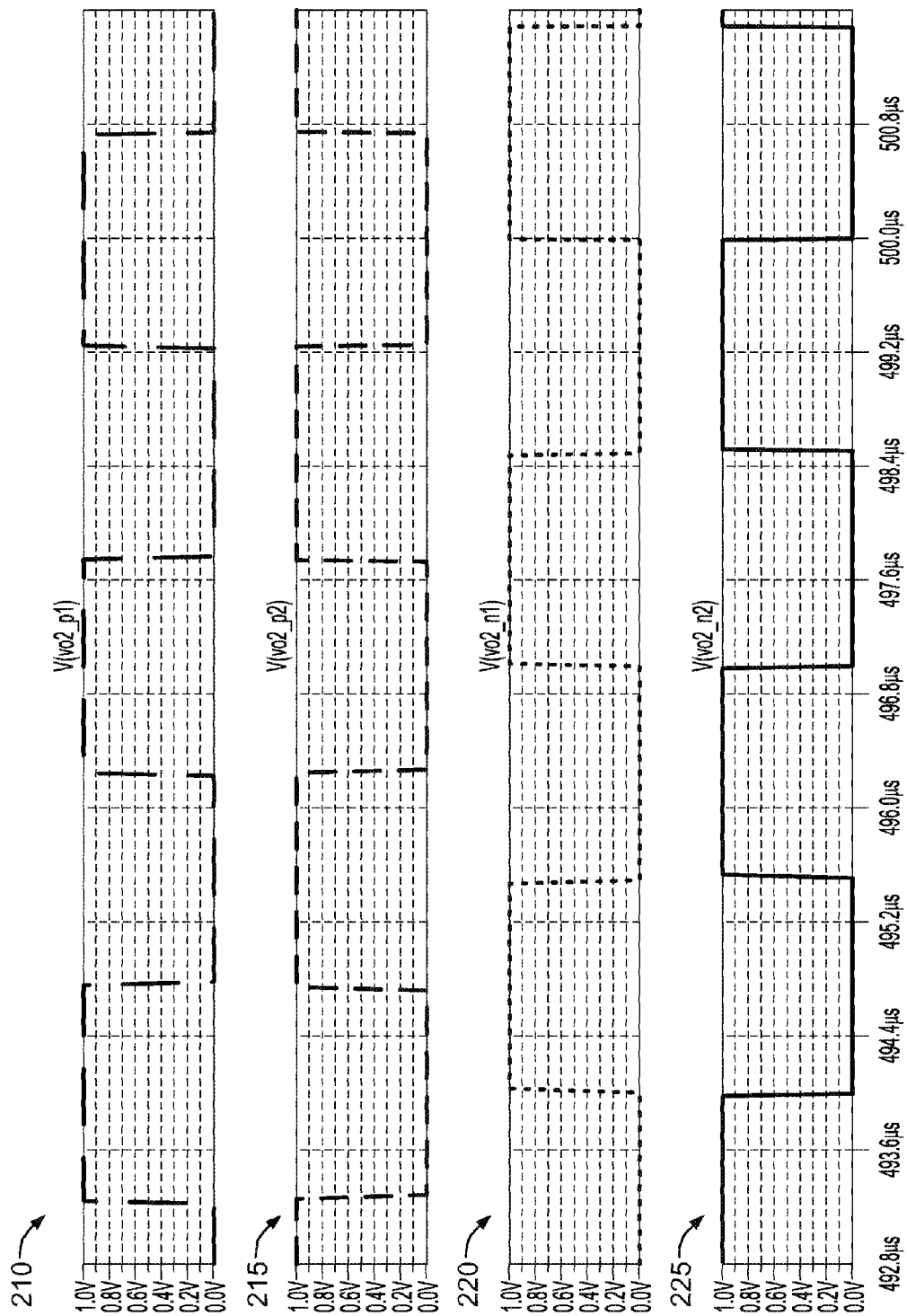

FIG. 2B-2D show various interleaving configurations that can be implemented in the system 200. For example, FIG. 2B shows a configuration where the outputs of the amplifiers 110a-110d are not interleaved (i.e., the outputs are all in the same phase). Specifically, the plots 210, 215, 220, and 225 represent the output voltages of the amplifiers 110a, 110b, 110c, and 110d, respectively. In the example of FIG. 2B, where the duty cycle is 50% for each of the different amplifiers, the absence of any interleaving results in the amplifiers being switched on and off substantially simultaneously. The 50% duty cycle is used throughout this document for illustrative purposes. However, the technology described herein is applicable for other duty cycle values, which may or may not be the same in the various amplifiers.

FIG. 2C shows another configuration, where the relative phases of the amplifiers 110a, 110b, 110c, and 110d are 0, 180°, 0, and 180°, respectively. In this document, this configuration is referred to as INT1. For the 50% duty cycle example depicted in FIG. 2C, the INT1 configuration results in the amplifiers 110a and 110c switching on and off substantially simultaneously, the amplifiers 110b and 110d switching on and off substantially simultaneously, and the on periods of the first pair coinciding with the off periods of the second pair (and vice versa). FIG. 2D shows yet another configuration, where the relative phases of the amplifiers 110a, 110b, 110c, and 110d are 0, 180°, 90°, and 270°, respectively. In this document, this configuration is referred to as INT2. For the 50% duty cycle example depicted in FIG. 2D, the INT2 configuration results in the on and off periods of the amplifiers 110a and 110b being complimentary to one another, the on and off periods of the amplifiers 110c and 110d being complimentary to one another, and the on and off periods of the first and second pairs being out of phase by 90°.

While a few specific examples of interleaving configurations are shown in FIGS. 2B-2D, various other interleaving configurations are possible. The interleaving configurations can be selected based on one or more criteria of the specific application. For example, the INT1 configuration can be selected for reducing electromagnetic radiation in the CM mode, and the INT2 configuration can be selected for operations where the DM operations are important. As such, the selected interleaving configurations affect the input voltage to the filter circuit and the voltage at the output of the filter circuit in CM and DM.

While interleaving the outputs of the amplifiers 110 reduces ripple currents, some applications may require additional suppression of ripple currents. For example, in audio applications—particularly in an automotive context—further suppression of output ripple currents are required. In some implementations, the additional suppression may be required in order to adhere to electromagnetic interference (EMI) constraints of the particular application. For example, in automotive audio systems, the connectors between the amplifiers and the speakers are often several meters long, and a high degree of ripple current suppression is required to adhere to EMI emission constraints typically used in the automotive industry. Additional suppression of ripple currents can be achieved using an LC filter circuit between the amplifiers and the load (e.g., the speaker).

Figure 3A:
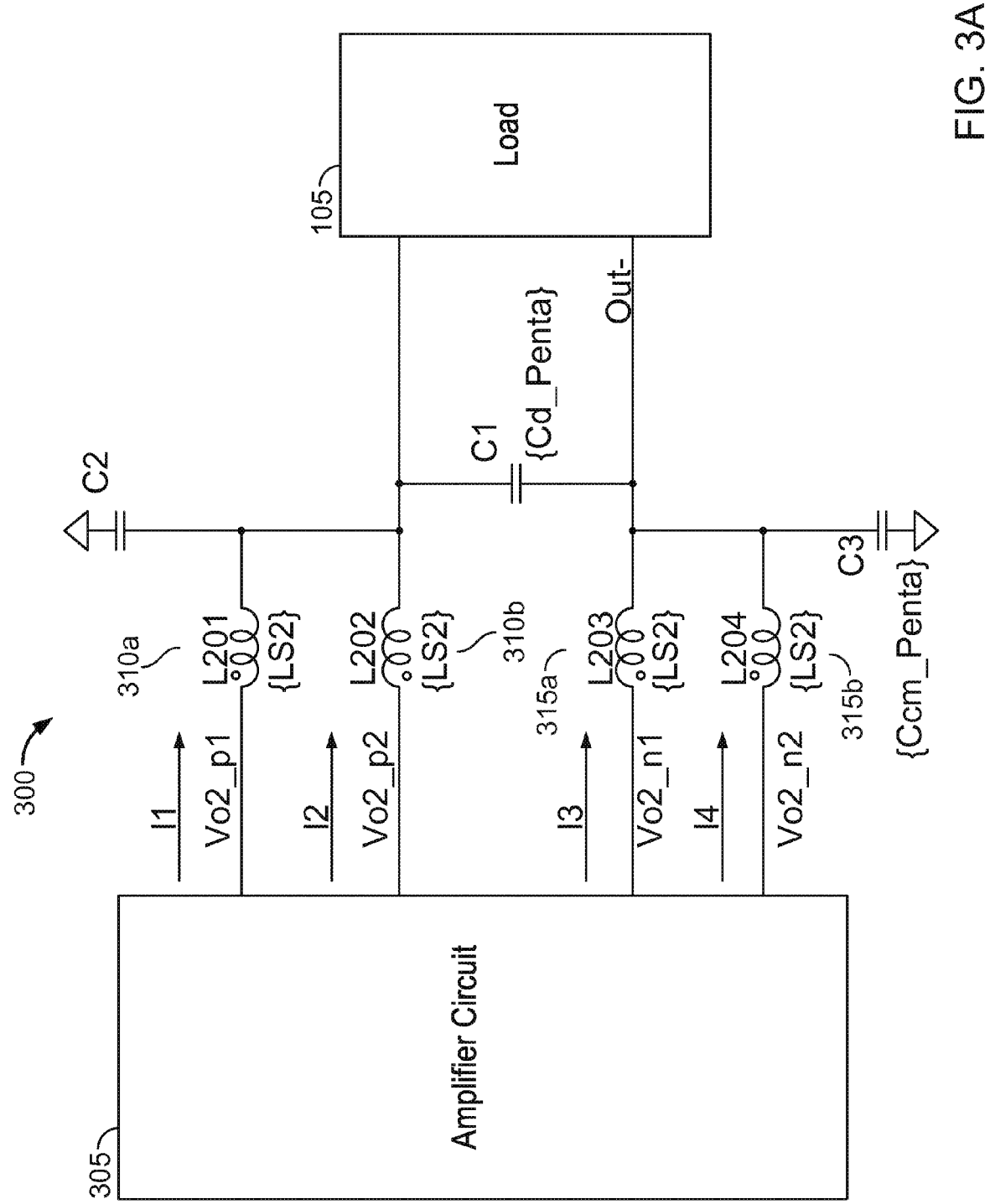
FIG. 3A is a circuit diagram of an example filter circuit that can be used in the system of FIG. 2A, the filter circuit including four inductors inductively coupled with one another.

FIG. 3A depicts a circuit diagram of a circuit that includes an example LC filter circuit 300. The amplifier circuit 305 includes at least four switching amplifiers 110 (as shown in FIG. 1) that drive the load 105 from both sides. In some implementations, half of the amplifiers 110 in the amplifier circuit 305 drive the load 105 from one side (e.g., the positive side) and the other half of the amplifiers 110 drive the load 105 from the opposite side (e.g., the negative side). Correspondingly, the filter circuit 300 includes a number of inductors equal to the number of amplifiers in the amplifier circuit 305. The inductors 310a and 310b (310, in general) connected to the positive side of the load 105 and the inductors 315a and 315b (315, in general) are connected to the negative side of the load 105. In some implementations, the inductors 310 are implemented by winding a conductor around a core of magnetic material in one direction (e.g., clockwise), and the inductors 315 are implemented by winding a conductor around a core of magnetic material in another direction (e.g., anti-clockwise).

Figures 3B, 3C, 3D:
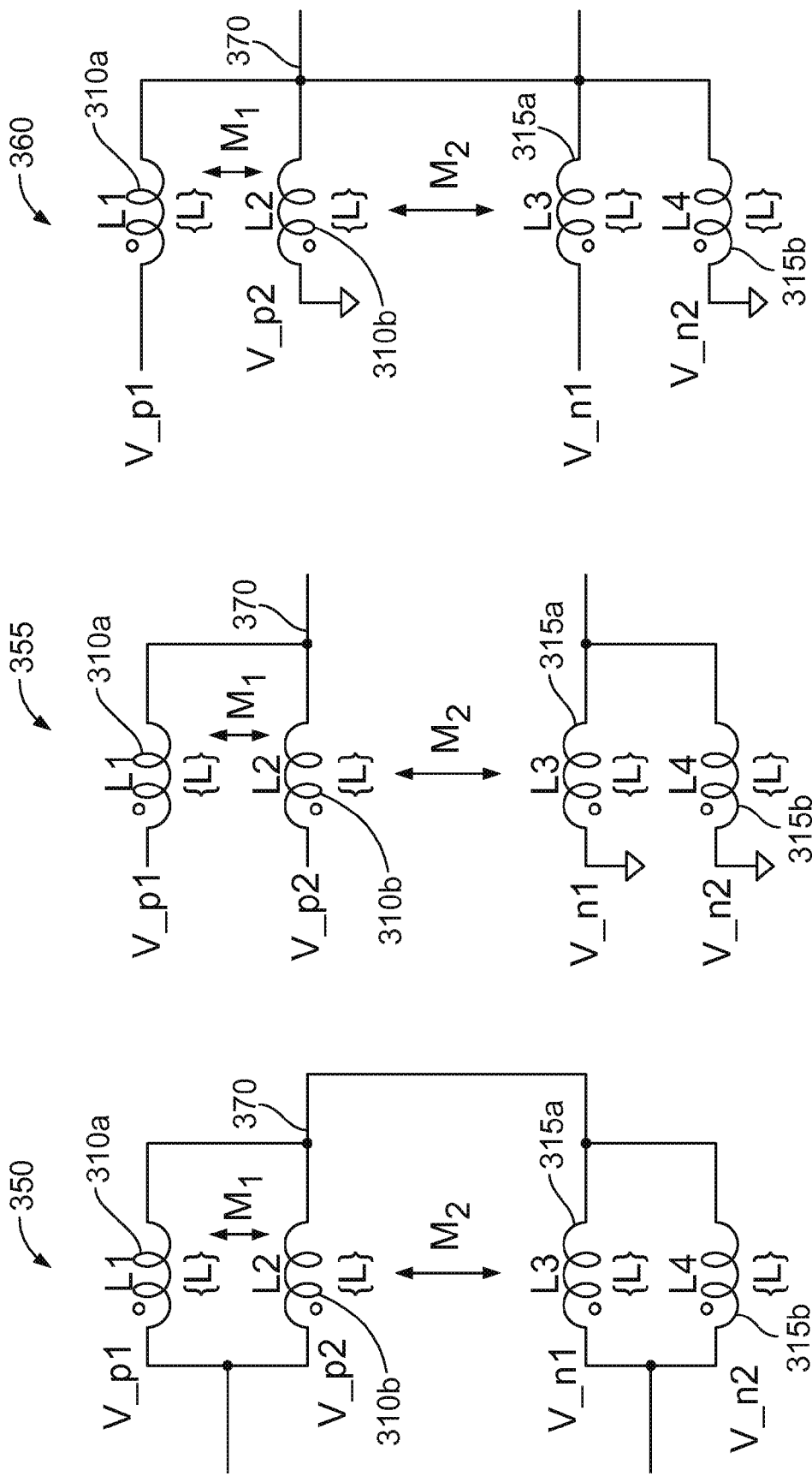
FIGS. 3B-3D illustrate various differential mode configurations of the filter circuit of FIG. 3A.

In some implementations, the four or more inductors of the filter circuit 300 are inductively coupled to one another. This can result in different inductances in the CM and DM. For example, coupling the inductors can result in a high CM inductance, and various DM inductances based on the particular DM configuration. FIGS. 3B-3E show the various ways in which the four inductors of the example shown in FIG. 3A may be coupled in the CM configuration and the various DM configurations. For example, FIG. 3B shows a first DM configuration 350 (also referred to in this document as DM1) in which both positive side amplifiers are driving current through the corresponding inductors 310 and both negative side amplifiers are driving current through the corresponding inductors 315. In the DM1 configuration, the corresponding inductance is given by:

$$L_{D1} = 2\left(\frac{L+M_1}{2} - M_2\right) \quad \text{(equation 1)}$$

where L denotes self-inductance, $M_1$ denotes the mutual inductance between the inductors on each of the positive and negative sides, and $M_2$ denotes the mutual inductance between the positive and negative sides.

FIG. 3C shows a second DM configuration 355 (also referred to in this document as DM2) in which both positive side amplifiers are driving current through the corresponding inductors 310 but both negative side amplifiers are grounded. In the DM2 configuration, the corresponding inductance of the filter circuit is given by:

$$L_{D2} = 2(L - M_1) \quad \text{(equation 2)}$$

FIG. 3D shows a third DM configuration 360 (also referred to in this document as DM3) in which one of the positive side amplifiers (e.g., 310a) and one of the negative side amplifiers (e.g., 315a) are driving current through the corresponding inductors, while the other of the positive side amplifiers (e.g., 310b) and the other of the negative side amplifiers (e.g., 315b) are grounded. In the DM3 configuration, the corresponding inductance of the filter circuit is given by:

$$L_{D3} = 2(L - M_2) \quad \text{(equation 3)}$$

FIG. 3E shows the common mode configuration 365. In this configuration, substantially the same voltage is applied to all inputs of the filter. In the common mode configuration, the corresponding inductance is given by:

$$L_C = \frac{\frac{L+M_1}{2} + M_2}{2} \quad \text{(equation 4)}$$

In the examples of FIG. 3B-3E, the mutual inductance between the two positive side inductors, and the mutual inductance between the two negative side inductors are assumed to be equal to $M_1$. Also, the mutual inductance between any inductor on the positive side and any inductor on the negative side is assumed to be equal to $M_2$. In some implementations, coupling between the four inductors may be described by a 4×4 matrix given by:

$$\begin{bmatrix} L11 & L12 & L13 & L14 \\ L21 & L22 & L23 & L24 \\ L31 & L32 & L33 & L34 \\ L41 & L42 & L43 & L44 \end{bmatrix}$$

Assuming the same self-inductance L for each of the inductors, and under the conditions that
L12=L21=M1,
L34=L43=M1, and
L13=L14=L23=L24=L31=L32=L41=L42=M2,
the coupling matrix may be represented in the following simplified form:

$$\begin{bmatrix} L & M1 & M2 & M2 \\ M1 & L & M2 & M2 \\ M2 & M2 & L & M1 \\ M2 & M2 & M1 & L \end{bmatrix}$$

The CM configuration and the three different DM configurations can be represented with respect to the various voltages and currents at different nodes in the filter circuit. For example, if the input voltages to the filter for the three DM and one CM configurations are denoted as $v_{d1}$, $v_{d2}$, $v_{d3}$, and $v_c$, the different output voltages can be represented as:

$$\begin{bmatrix} v_{d1} \\ v_{d2} \\ v_{d3} \\ v_c \end{bmatrix} = \frac{1}{4}\begin{bmatrix} 1 & 1 & -1 & -1 \\ 1 & -1 & 0 & 0 \\ 1 & 0 & -1 & 0 \\ 1 & 1 & 1 & 1 \end{bmatrix}\begin{bmatrix} v_{p1} \\ v_{p2} \\ v_{n1} \\ v_{n2} \end{bmatrix} \quad \text{(equation 5)}$$

where $v_{p1}$ and $v_{p2}$ denote the output voltages of the two positive side amplifiers and $v_{n1}$ and $v_{n2}$ represent the output voltages of the two negative side amplifiers. Further if the output currents from the two positive amplifiers are denoted as $i_{p1}$ and $i_{p2}$, respectively, and the output currents from the two negative amplifiers are denoted as $i_{n1}$ and $i_{n2}$, respectively, the CM and DM currents can be represented as:

$$\begin{bmatrix} i_{p1} \\ i_{p2} \\ i_{n1} \\ i_{n2} \end{bmatrix} = \begin{bmatrix} 1 & 2 & 0 & 1 \\ 1 & -2 & 0 & 1 \\ 1 & 2 & -4 & 1 \\ -3 & -2 & 4 & 1 \end{bmatrix}\begin{bmatrix} i_{d1} \\ i_{d2} \\ i_{d3} \\ i_c \end{bmatrix} \quad \text{(equation 6)}$$

where $i_{d1}$, $i_{d2}$, and $i_{d3}$ denote the total output current (or load current) in the DM1, DM2, and DM3 configurations, respectively, and is denotes the total output current in the common mode.

FIG. 3F depicts the various currents $u_{p1}$, $i_{p2}$, $i_{n1}$, and $i_{n2}$. Further the total currents flowing through the nodes 371 and 372 are denoted as $i_{o,p}$ and $i_{o,n}$ respectively. Using equation 6, the total currents from the positive and negative sides currents can be denoted as:

$$\begin{bmatrix} i_{o,p} \\ i_{o,n} \end{bmatrix} = \begin{bmatrix} i_{p1}+i_{p2} \\ i_{n1}+i_{n2} \end{bmatrix} = \begin{bmatrix} 2 & 0 & 0 & 2 \\ -2 & 0 & 0 & 2 \end{bmatrix}\begin{bmatrix} i_{d1} \\ i_{d2} \\ i_{d3} \\ i_c \end{bmatrix}. \quad \text{(equation 7)}$$

Further, because the CM output current ($i_{o,CM}$) is an average of the total currents from the positive and negative sides, and the DM output current ($i_{o,DM}$) is the difference between the total currents from the two sides, the CM and DM output currents can be represented as:

$$\begin{bmatrix} i_{o,CM} \\ i_{o,DM} \end{bmatrix} = \begin{bmatrix} \frac{i_{o,p} + i_{o,n}}{2} \\ i_{o,p} - i_{o,n} \end{bmatrix} =$$ (equation 8)

$$\begin{bmatrix} 0 & 0 & 0 & 4 \\ 4 & 0 & 0 & 0 \end{bmatrix} \begin{bmatrix} i_{d1} \\ i_{d2} \\ i_{d3} \\ i_c \end{bmatrix} = \begin{bmatrix} 1 & 1 & 1 & 1 \\ 1 & 1 & -1 & -1 \end{bmatrix} \begin{bmatrix} i_{p1} \\ i_{p2} \\ i_{n1} \\ i_{n2} \end{bmatrix}$$

Equation 8 shows that the DM component at the load side $i_{o,DM}$ (which may be the quantity of interest in various applications), depends only on the DM1 component of current at the input side of inductors. Therefore a desired DM output voltage at load terminal requires only a control over the DM1 component of input voltage and an appropriately designed DM1 inductance. Equation 8 also shows that DM2 and DM3 components do not contribute to DM output voltage even through the components affect the ripple currents in the inductors by affecting the currents flowing between the inductors. For this reason, the DM2 and/or DM3 inductances may need to be designed to achieve reduction in ripple currents.

In some implementations, the inductors 310a, 310b, 315a, and 315b can be implemented on a structure of magnetic material that includes four cores or legs each for supporting one of the inductors. Implementing the inductors on an integrated structure allows for effective coupling between the inductors and in turn facilitates implementation of high inductance values (both in CM and DM configurations) within a small physical volume. The dimensions of the structure can be designed such that the structure supports low-cost filters for complementing amplifier circuits with multiple class D amplifiers (the outputs of which may be interleaved in phase) in reducing ripple currents.

Figure 4A:
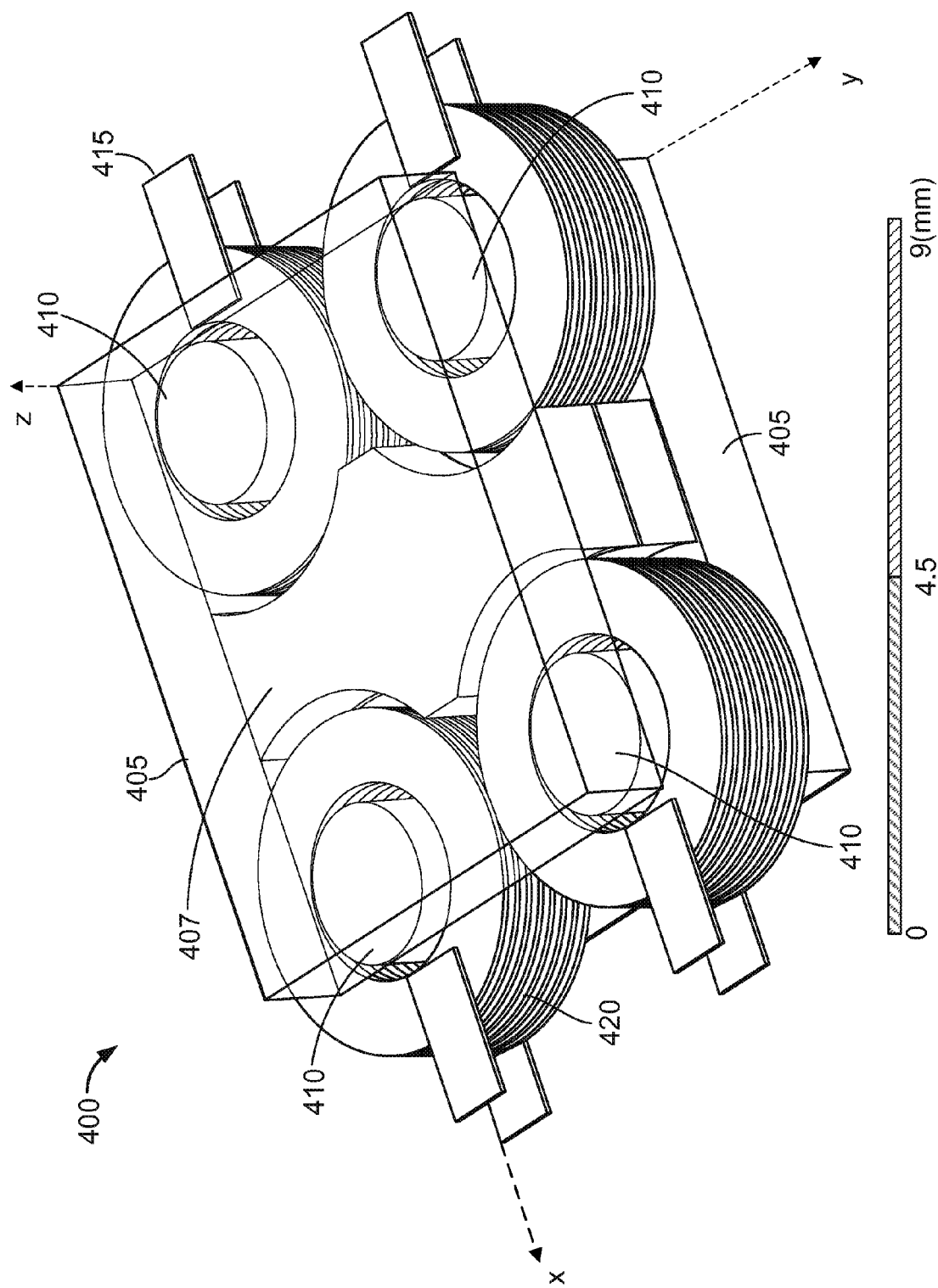
FIG. 4A is a partially transparent view of an example filter structure for supporting four coupled inductors.

FIG. 4A shows a partially transparent view of an example filter structure 400 for supporting four coupled inductors. The structure 400 includes four cores or legs 410 of magnetic material each for supporting an inductor. The four cores 410 are supported on either side by a base 405. The four cores are separated from one another by a separator 407. The separator 407 encloses an air core within the structure 400 such that the air core can store magnetic energy in one of the DM configurations. Each of the magnetic cores 410 include an air-gap separating a first section and a second section, wherein each of the sections are supported by a corresponding base 405. As such, the entire structure 400 can be fabricated as two separate complementary pieces such that each piece includes a base 405, one half of each of the core 410, and one half of the separator 407. The inductors can be implemented on the structure by winding a conductor 420 around each of cores 410. The direction of winding (clockwise or anticlockwise) is selected based on whether the corresponding inductor is a positive side inductor or a negative side inductor. In some implementations, the structure 400 includes connectors 415 for connecting each of the inductors to other portions of the circuit.

FIG. 4B shows a lateral view of the filter structure of FIG. 4A. Specifically, FIG. 4B shows the first section 411 and second section 412 of the core 410 being separated by a layer 413 of adhesive (e.g., glue) of length $l_{gl}$. The adhesive layer 413 is an artifact of having two complementary pieces of the overall structure 400 being coupled to one another. Accordingly, the length of the adhesive layer is kept as small as possible (e.g., less than about 20 μm). In some implementations, where the entire structure 400 is molded as a single piece, it may be possible to avoid the adhesive layers 413. Each of the first section 411 and the second section 412 is supported by a corresponding base 405. In some implementations, the first section 411 and the second section 412 are implemented as projections of equal heights ($h_l$) extending from corresponding bases 405. The thickness of the base 405 can be denoted as $h_b$.

FIG. 4B also shows the air core structure that includes a hollow cavity 430 enclosed by a pair of focusing projections 425. The focusing projections 425 are portions of the separator structure 407, and are configured to focus magnetic field from the four magnetic cores 410 through the hollow cavity 430. For example, in a DM configuration, the focusing projections focus at least a portion of the magnetic field within the structure 400 through the hollow cavity 430 such that magnetic energy is stored in the hollow cavity 430. The energy per unit volume stored in the hollow cavity 430 by a magnetic field B is given by:

$$u = \frac{1}{2}\frac{B^2}{\mu}$$ (equation 9)

where μ is the magnetic permeability of the medium. In this example, the medium is air, which has a magnetic permeability substantially equal to 1. This allows for a high amount of energy to be stored in the hollow cavity 430. In a CM configuration, the magnetic field within the structure 400 traverses primarily through the cores 410 and the bases 405. Because the magnetic permeability of the material of the structure is high (e.g., ~1000), the energy stored in the CM configuration is negligible, thereby resulting in higher inductance values in the CM configuration as compared to the inductance values in the DM configurations. This can be useful, for example, in audio applications where any modulation in the common mode results in RF noise, and high CM inductances are useful in reducing such noise because it results in lower CM corner frequency.

FIG. 4C shows a top view of the filter structure of FIG. 4A. In some implementations, the magnetic cores 410 and the air core are substantially circular in cross section. However, other shapes of the cross-sections of the magnetic cores 410 and/or the air core are also possible. In some implementations, the spatial distribution of the magnetic cores 410 and the air core, as well as various dimensions of the structure 400 can be selected based on various design criteria associated with the filter. For example, the spatial distribution of the magnetic cores can be selected based on mutual inductance values desired for coupling the four inductors. In some implementations, the distances are selected such that mutual inductance value between the similar coils (e.g., coils with the same direction of winding) is approximately −0.3, and the mutual inductance value between the dissimilar coils (e.g., coils with opposite direction of winding) is approximately 0.3.

In some implementations, the constraints for designing the structure 400 can include the flux density in the air core and/or flux densities in the magnetic cores 410. For example, the flux density of the air core can be represented as:

$$B_c = \left(\frac{4(2+\alpha)}{(3+\alpha)(4+\alpha)}\right)\frac{\mu_0 NI}{l_{gc}}$$ (equation 10)

where $\mu_o$ represents the magnetic permeability of air, N is the number of turns in the winding, and I is the current through the winding. The flux density in each of the magnetic core can be represented as:

$$B_l = \left(\frac{\alpha(2+\alpha)}{(3+\alpha)(\alpha+4)}\right)\frac{\mu_0 NI}{l_{gl}} \quad \text{(equation 11)}$$

wherein $\alpha$ is a ratio given by:

$$\alpha = \frac{A_c l_{gl}}{A_l l_{gc}} \quad \text{(equation 12)}$$

and $A_c$ and $A_l$ are cross sectional areas of the air core and each of the magnetic cores, respectively. In some implementations, $A_c$ and $A_l$ are selected such that the flux distribution within the structure 400 is uniform. For example, $A_c$ can be selected such that it is substantially equal to the combined cross sectional areas of all the cores.

Some advantages of the technology described herein are illustrated using the following examples. In the following examples, a filter circuit with uncoupled inductors (represented in FIG. 5A) is compared with the filter circuit 300 (which is reproduced as FIG. 5B for comparison purposes) to illustrate various advantages of using a filter circuit where at least four inductors are inductively coupled with one another.

Figure 5A:
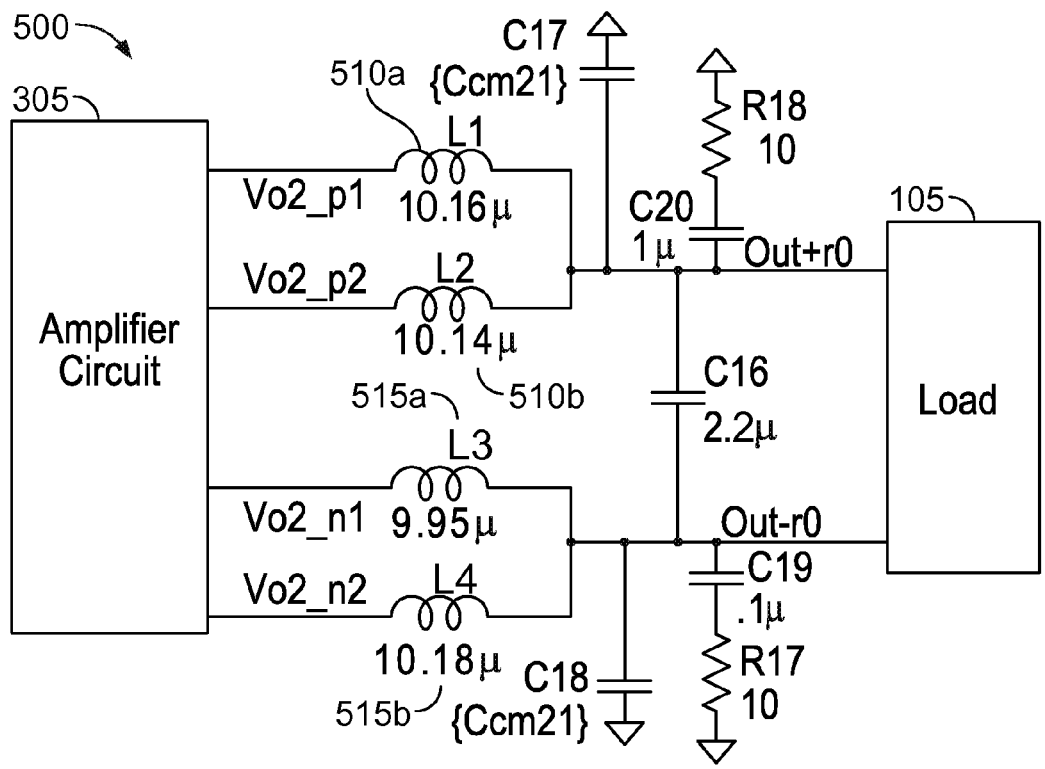
FIG. 5A shows a filter circuit with uncoupled inductors.
Figure 5B:
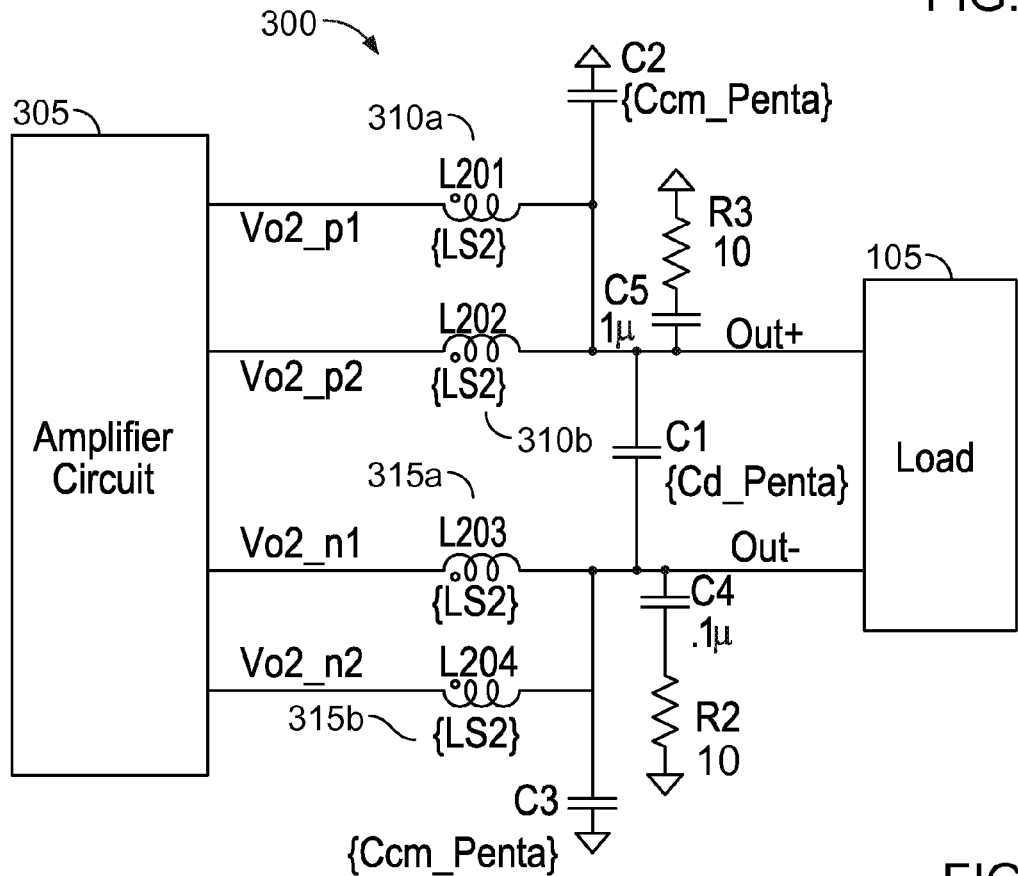
FIG. 5B is a reproduction of the filter circuit depicted in FIG. 3A.

FIG. 6A shows plots that compare inductor currents in the various inductors in the circuits of FIGS. 5A and 5B when the outputs of the switching amplifiers in the amplifier circuit 305 were not interleaved. Each of the plots in FIG. 6A shows two traces. In the plot 610, the trace 602a depicts the time variation in the current through the positive side inductor 510a of FIG. 5A. The trace 604a depicts the time variation in the current through the positive side inductor 310a of FIG. 5B. Similarly, the trace 602b in the plot 615 depicts the time variation in the current through the positive side inductor 510b of FIG. 5A, and the trace 604b depicts the time variation in the current through the positive side inductor 310b of FIG. 5B. The traces 602c and 604c in the plot 620 depict the time variation in the current through the negative side inductors 515a and 315a, respectively, and the traces 602d and 604d in the plot 625 depict the time variation in the current through the negative side inductors 515b and 315b, respectively. The plots 610, 615, 620, and 625 each illustrate that the ripple (i.e., peak-to-peak variation) in the current through the corresponding inductor was reduced in the circuit of FIG. 5B, i.e., when the four inductors were coupled to one another using technology described above in this document.

Figure 6B:
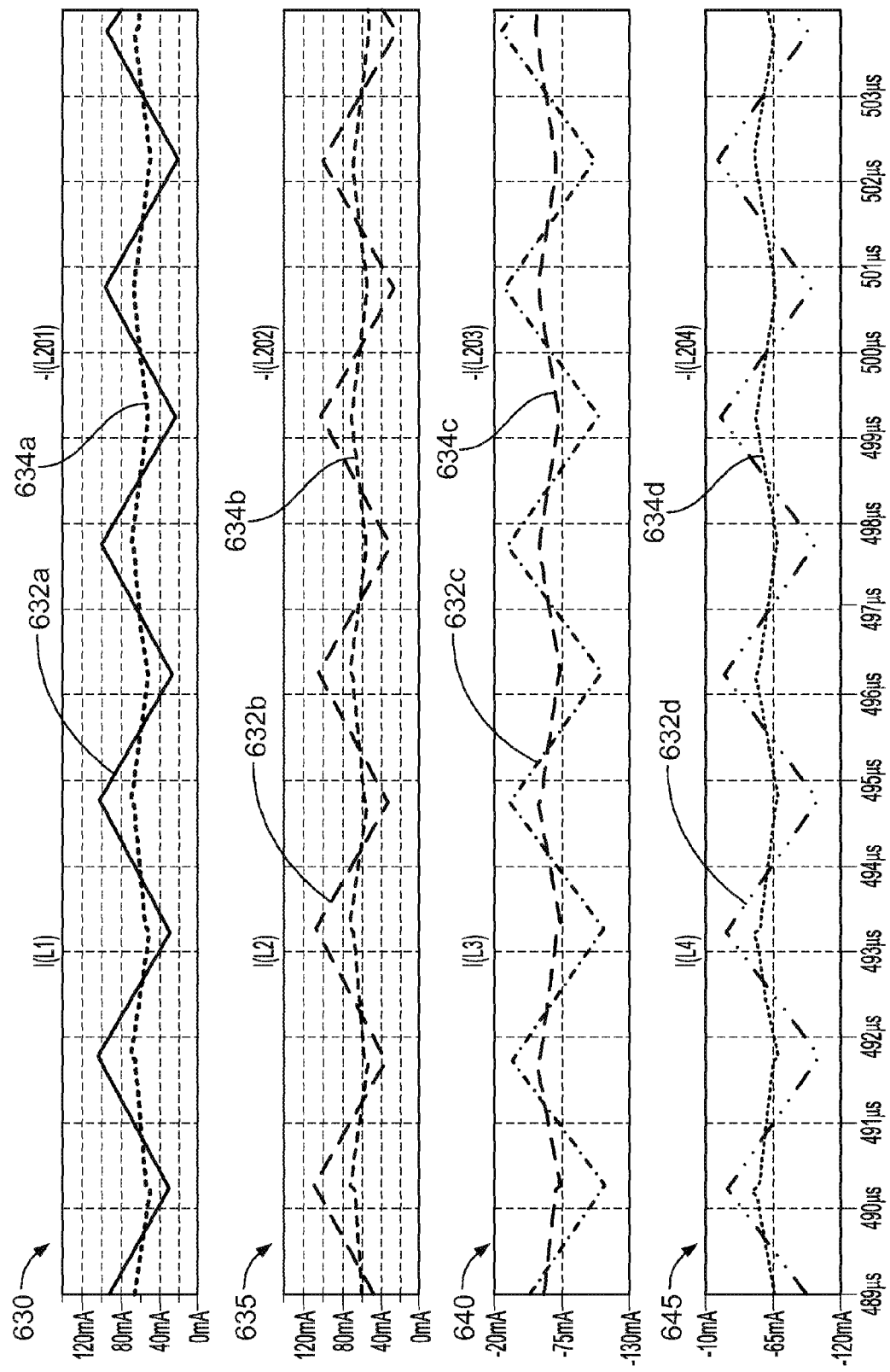
Figure 6C:
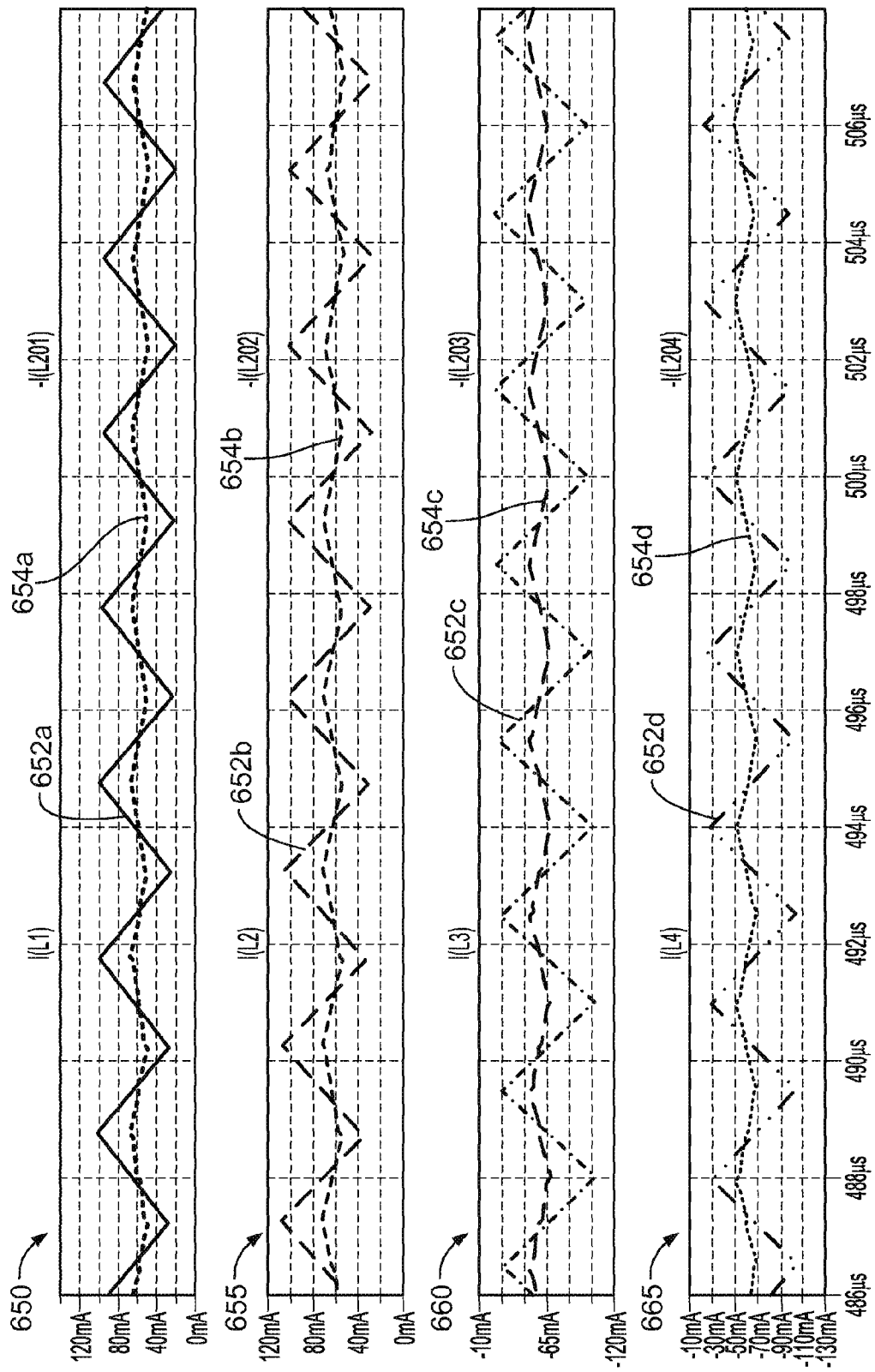

FIGS. 6B and 6C show corresponding results for cases in which the outputs of the switching amplifiers in the amplifier circuit 305 were interleaved. FIG. 6B shows results for the INT1 scheme of interleaving, and FIG. 6C shows results for the INT2 scheme of interleaving. In FIG. 6B, each of the traces 602a-602d (602, in general) depicts the variations in corresponding inductor currents for the circuit of FIG. 5A, and of the traces 604a-604d (604, in general) depicts the variations in corresponding inductor currents for the circuit of FIG. 5B. The results illustrate that the ripple in the current through the corresponding inductors was reduced in the circuit of FIG. 3B for the INT1 interleaving. In FIG. 6C, each of the traces 652a-652d (652, in general) depicts the variations in corresponding inductor currents for the circuit of FIG. 5A, and of the traces 654a-654d (654, in general) depicts the variations in corresponding inductor currents for the circuit of FIG. 5B. The results illustrate that the ripple in the current through the corresponding inductors was reduced in the circuit of FIG. 3B for the INT2 interleaving.

Figure 6D:
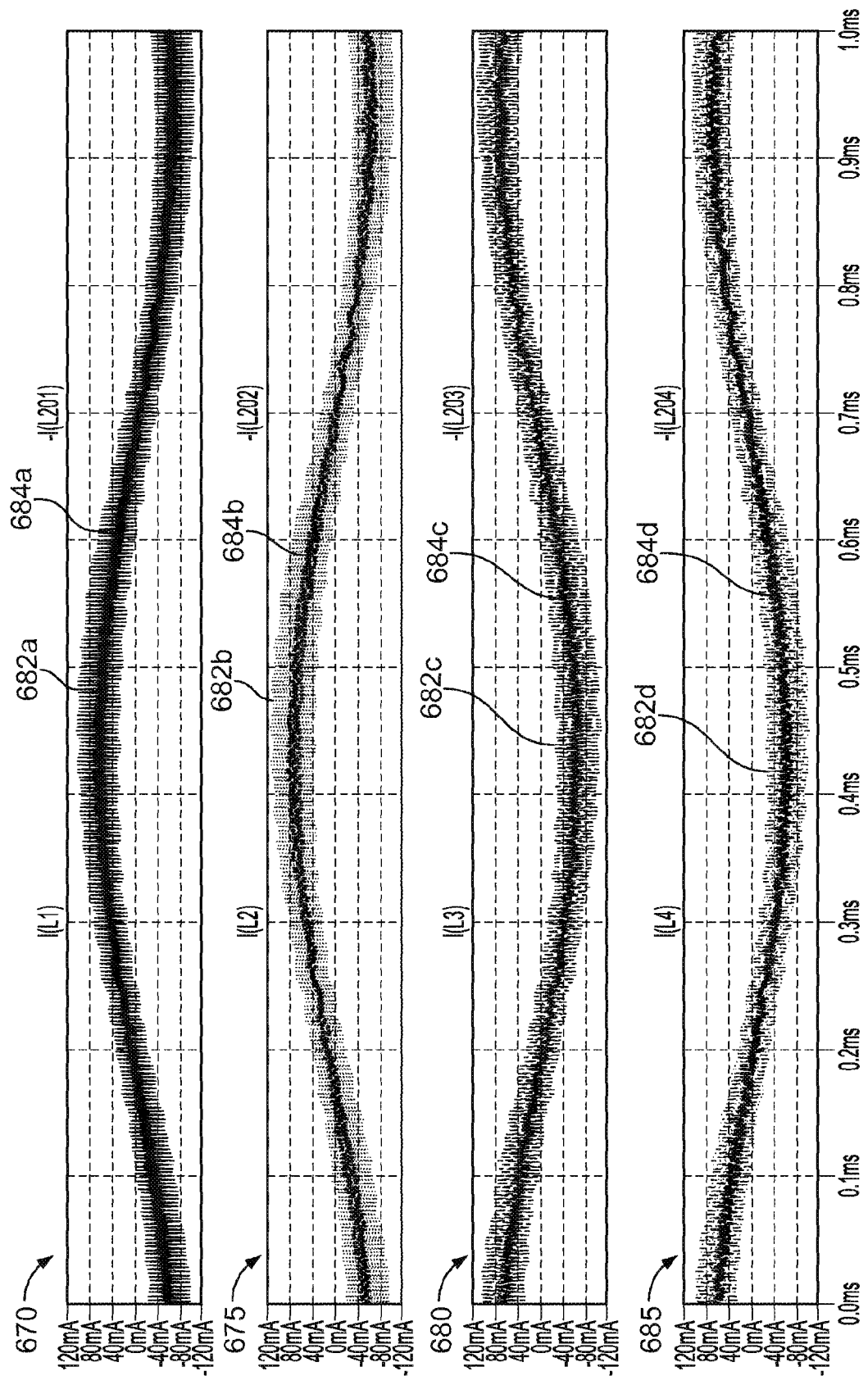

FIG. 6D shows comparative variations in the different inductor currents over a longer range of time for the circuits of FIGS. 5A and 5B. The results shown are for the case when the amplifier outputs are interleaved in the INT2 configuration. In the plot 670, the trace 682a depicts the time variation in the current through the positive side inductor 510a of FIG. 5A. The trace 684a depicts the time variation in the current through the positive side inductor 310a of FIG. 5B. Similarly, the trace 682b in the plot 675 depicts the time variation in the current through the positive side inductor 510b of FIG. 5A, and the trace 684b depicts the time variation in the current through the positive side inductor 310b of FIG. 5B. The traces 682c and 684c in the plot 680 depict the time variation in the current through the negative side inductors 515a and 315a, respectively, and the traces 682d and 684d in the plot 685 depict the time variation in the current through the negative side inductors 515b and 315b, respectively. FIG. 6D illustrates that the ripples are consistently reduced for the various inductors via the use of the filter circuit of FIG. 5B.

Figure 7A:
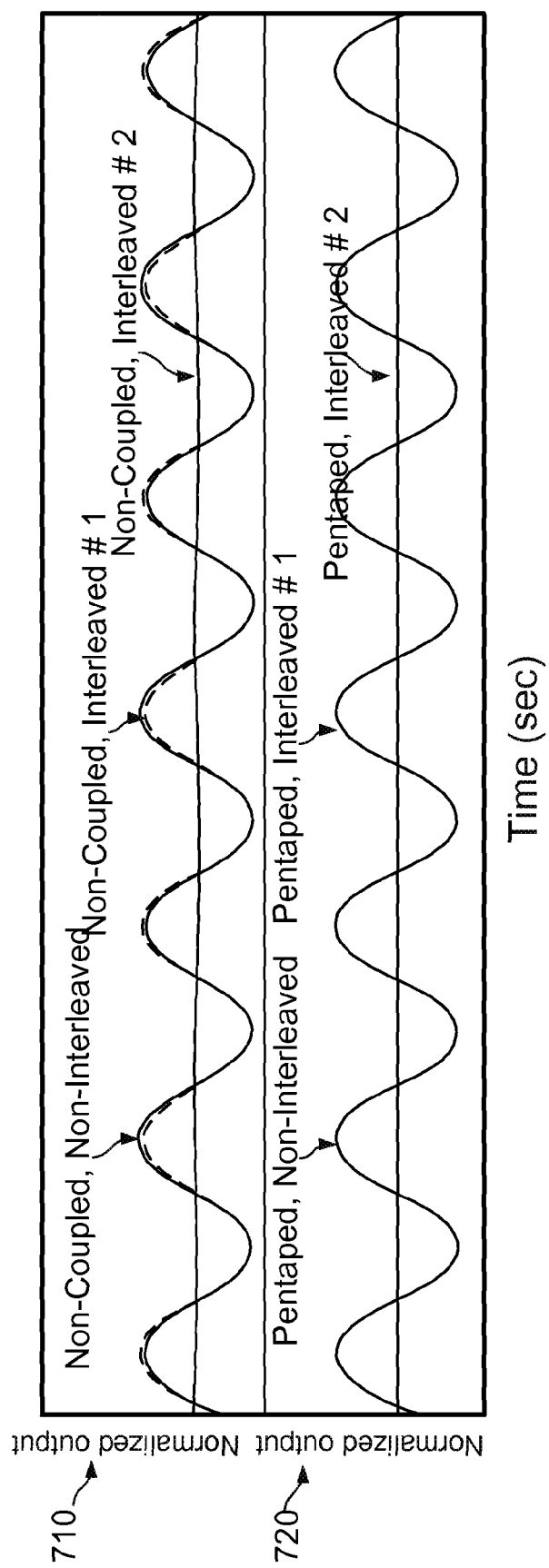
FIG. 7A is a plot that illustrates the effect of using the filter circuit of FIG. 5B on the differential mode voltages at the filter output.

FIG. 7A illustrates the effect of using the filter circuit of FIG. 5B on the DM voltages at the filter output. Plot 710 shows the DM voltage at the output for the filter circuit of FIG. 5A for the different interleaving configurations. FIG. 720 shows the corresponding traces for the filter circuit of FIG. 5B. As described above, the DM voltage at the output is often the signal of interest, and FIG. 7A illustrates that the general nature of the DM voltage at the filter output is not adversely affected by the filter circuit of FIG. 5B as compared to that of FIG. 5A.

Figure 7B:
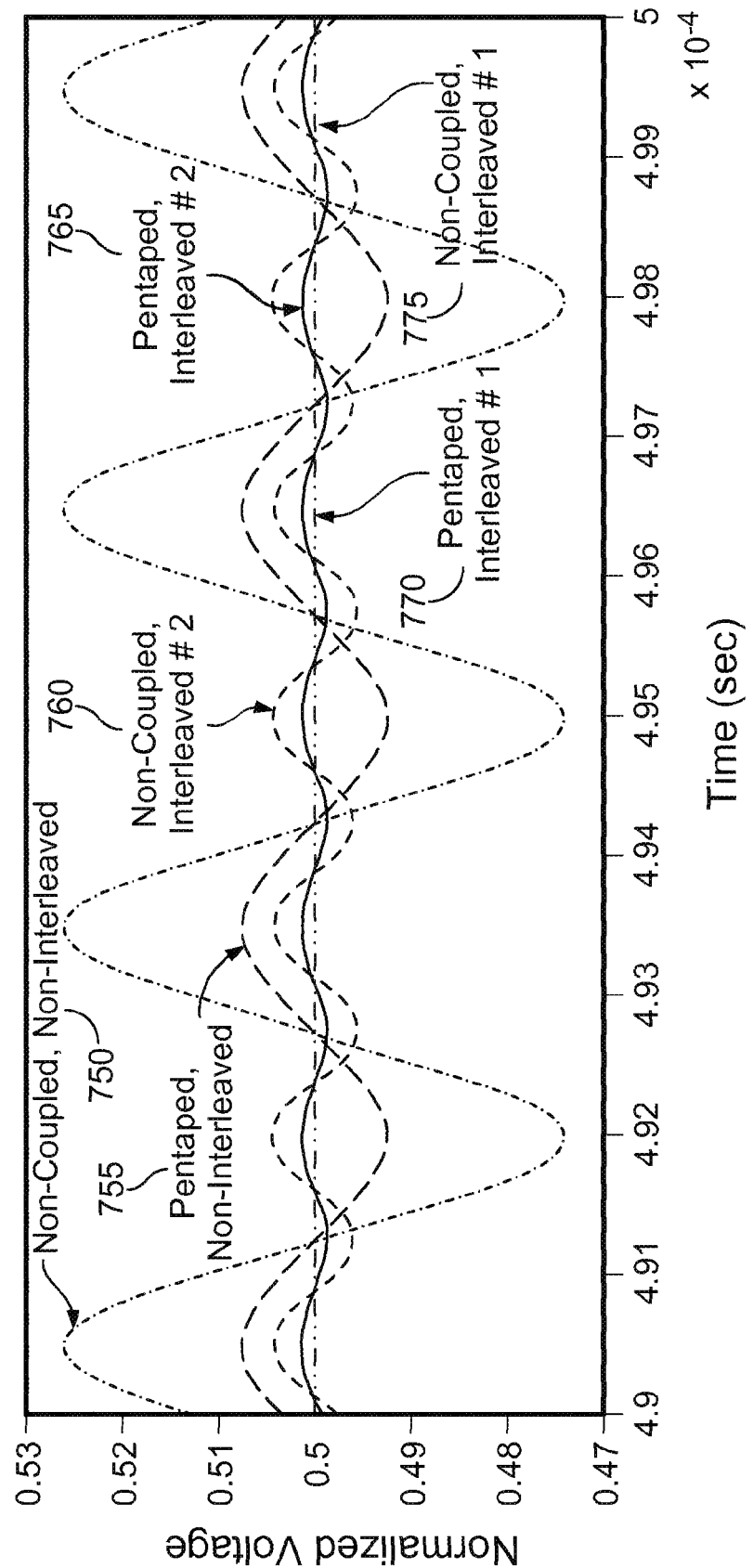
FIG. 7B is a plot that illustrates the effect of using the filter circuit of FIG. 5B on the common mode voltages at the filter output.

FIG. 7B illustrates the effect of using the filter circuit of FIG. 5V on the CM voltages at the filter output. As described above, the CM voltage is often an undesirable artifact the floating load, and it is usually preferable to have low CM components. FIG. 7B illustrates that the use of the filter circuit of FIG. 5B improves the CM performance for all interleaving configurations except for INT1, where the performance is substantially similar. For example, in a non-interleaved configuration of the amplifier outputs, the CM voltage level at the output of the filter of circuit of FIG. 5B (represented by the trace 755) is significantly lower than the corresponding CM voltage level in the circuit of FIG. 5A (represented by the trace 750). Similarly, for the INT1 configuration, the CM voltage level at the output of the filter in the circuit of FIG. 5B (represented by the trace 765) is significantly lower than the corresponding CM voltage level in the circuit of FIG. 5A (represented by the trace 760). The two corresponding traces 770 and 775 substantially coincide for the INT1 configuration, in which the inherent nature of the interleaving substantially eliminates CM voltage variations.

Figure 8A:
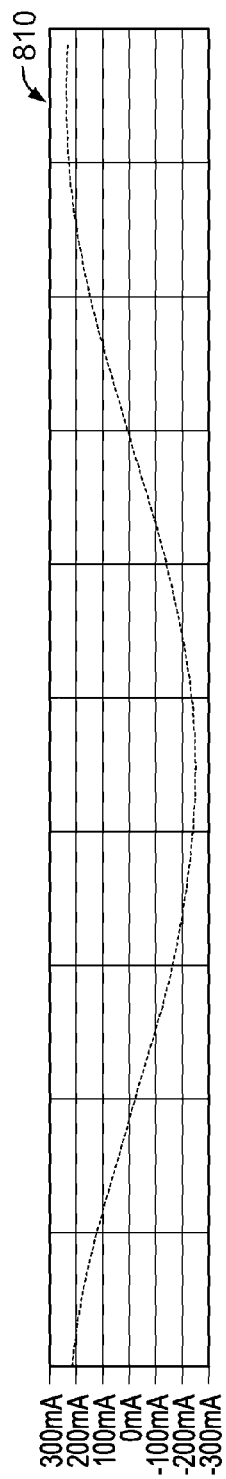
FIGS. 8A-8C are plots that illustrate the effects of using the filter circuit of FIG. 5B in conjunction with various interleaving schemes.
Figure 8A:
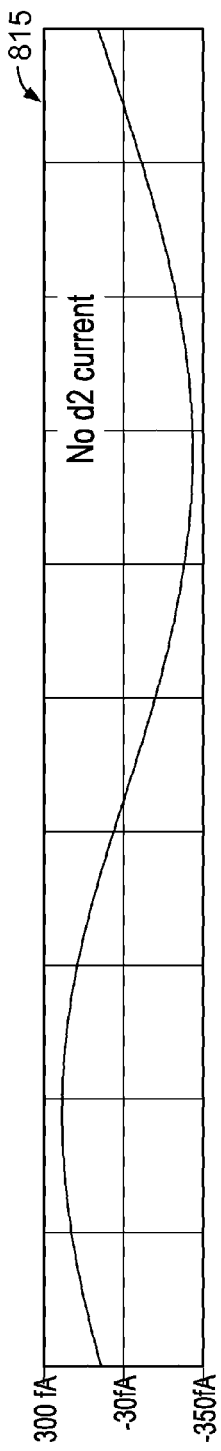
Figure 8A:
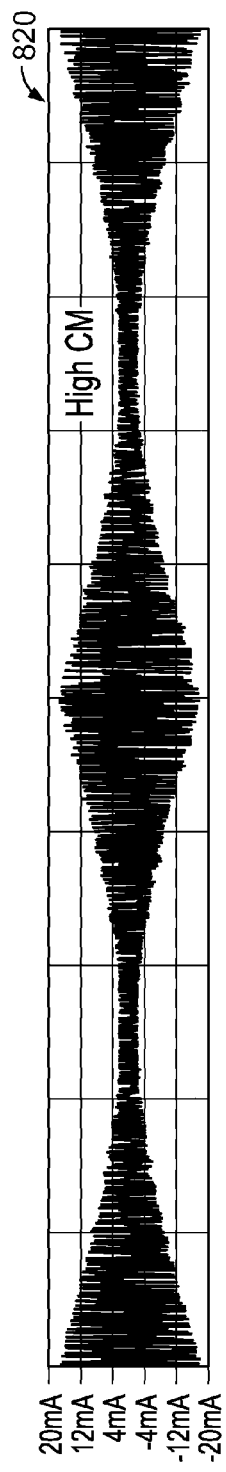
Figure 8A:
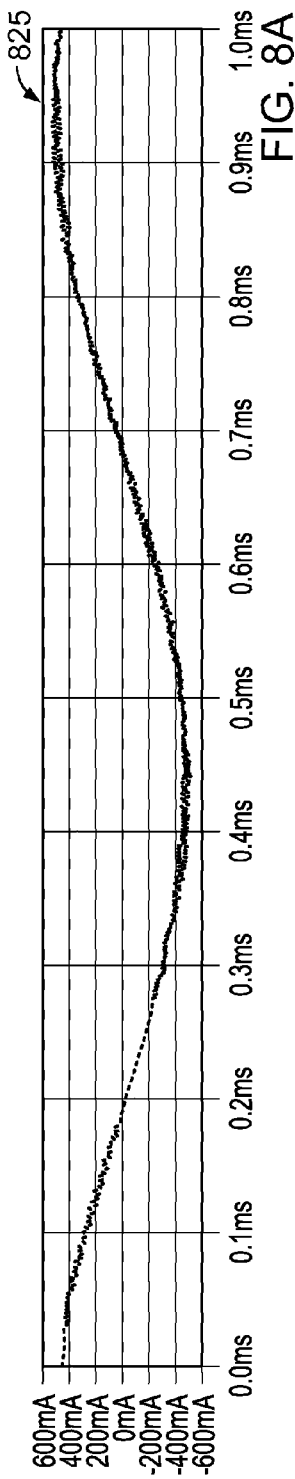
Figure 8B:
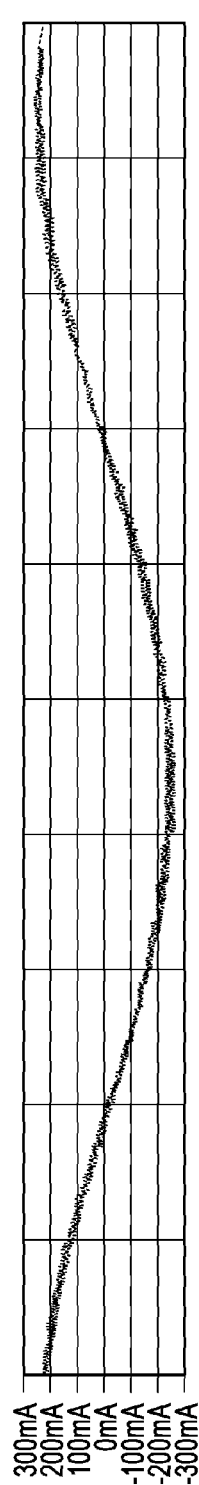
Figure 8B:
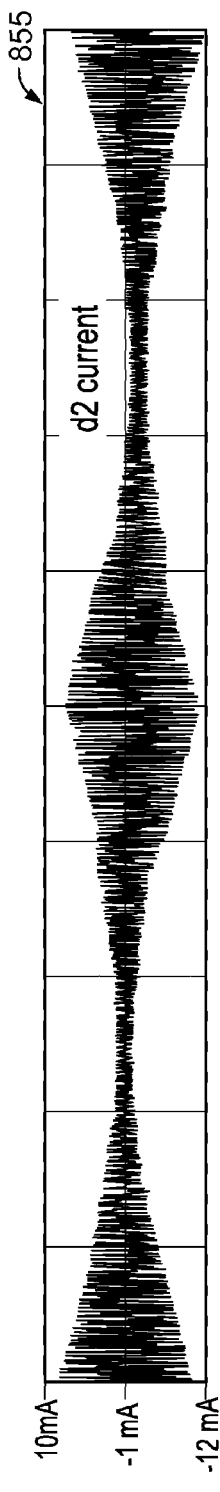
Figure 8B:
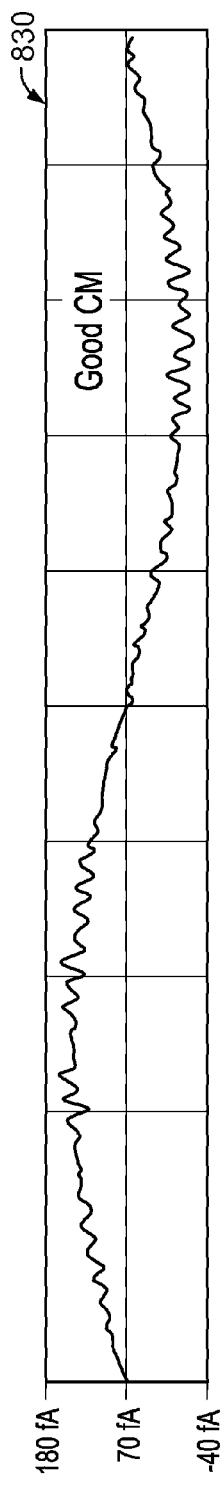
Figure 8B:
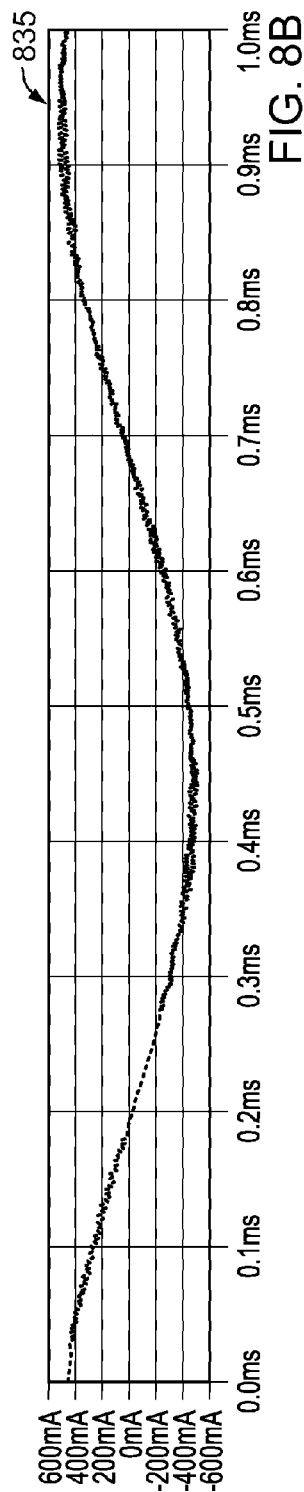
Figure 8C:
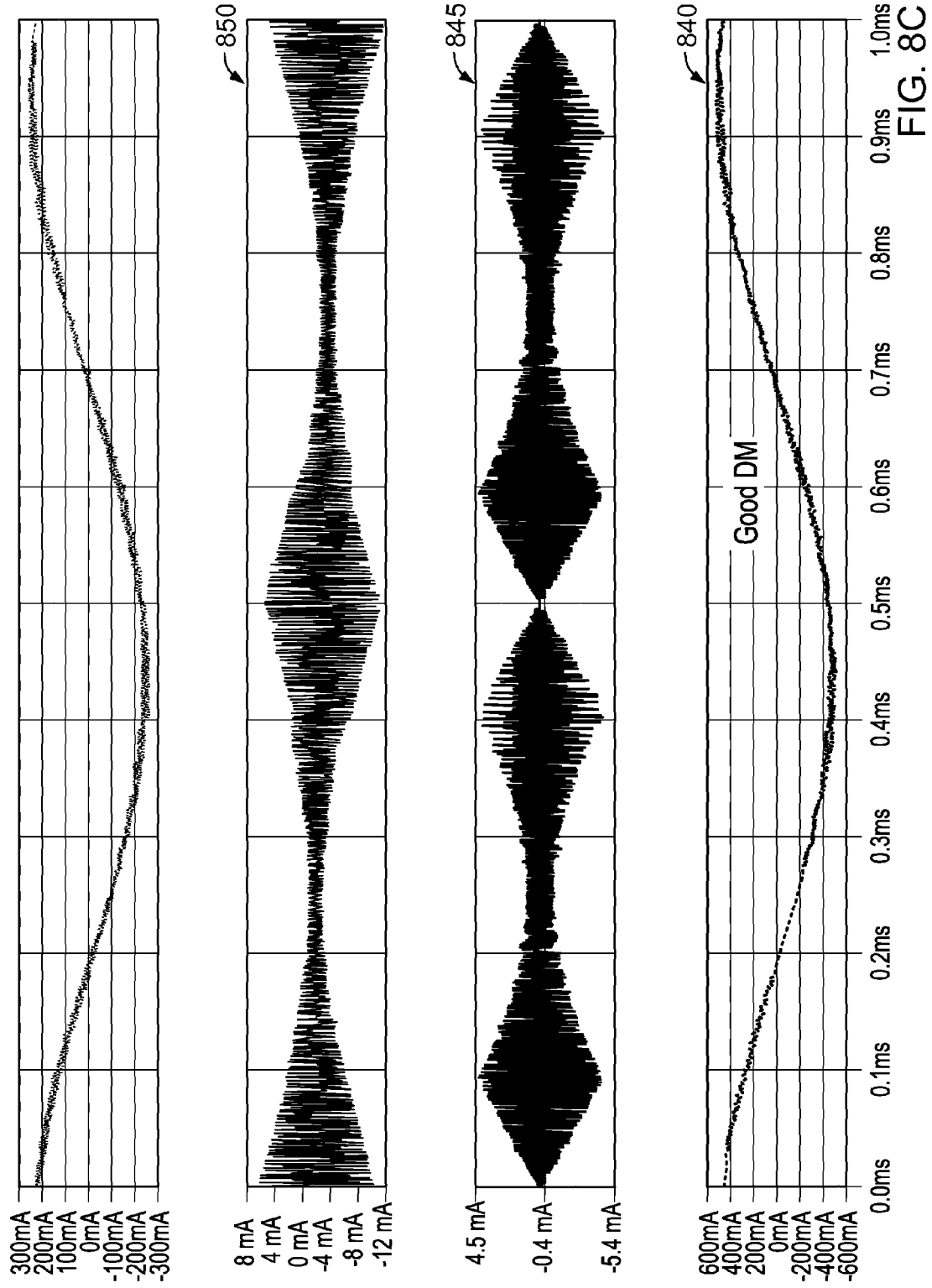

FIGS. 8A-8C further illustrate the effects of using the filter circuit of FIG. 5B in conjunction with various interleaving schemes. FIG. 8A depicts various CM and DM currents for a non-interleaved configuration of the amplifiers. Specifically, plot 810 depicts the DM3 current, plot 815 depicts the DM2 current, plot 820 depicts the CM current and plot 825 depicts the DM1 current. Of these, the DM1 current is the current that flows through the load. FIGS. 8B and 8C show the corresponding plots for the INT1 and INT2 configurations, respectively. FIGS. 8A-8C illustrate that the various interleaving schemes can be effective for different situations, and therefore be selected based on requirements of the specific application. For example, a comparison of the plots 825 (FIG. 8A), plot 835 (FIG. 8B), and plot 840 (FIG. 8C) show that the plot 840 depicts a DM1 current with the least amount of ripple. Accordingly, INT2 interleaving can be selected in conjunction with the filter circuit of FIG. 5B for applications requiring low ripple currents at the filter output.

This can be useful, for example, in automotive audio applications where the connectors between the filter circuit and the load (speakers) are significantly long (in the order of several meters), and low CM and DM1 ripple is needed to meet the associated EMI radiation constraints.

In another example, a comparison of the plots 820 (FIG. 8A), plot 830 (FIG. 8B), and plot 845 (FIG. 8C) show that the plot 830 depicts the lowest CM current. Accordingly, the INT1 interleaving configuration can be selected in conjunction with the filter circuit of FIG. 5B for applications that may require a low common mode current. Similarly, a comparison of the plots 815 (FIG. 8A), plot 855 (FIG. 8B), and plot 850 (FIG. 8C) show that the plot 815 depicts the lowest level of DM2 current. Accordingly, INT1 interleaving can be selected in conjunction with the filter circuit of FIG. 5B for applications requiring low DM2 current levels.

Figure 9A:
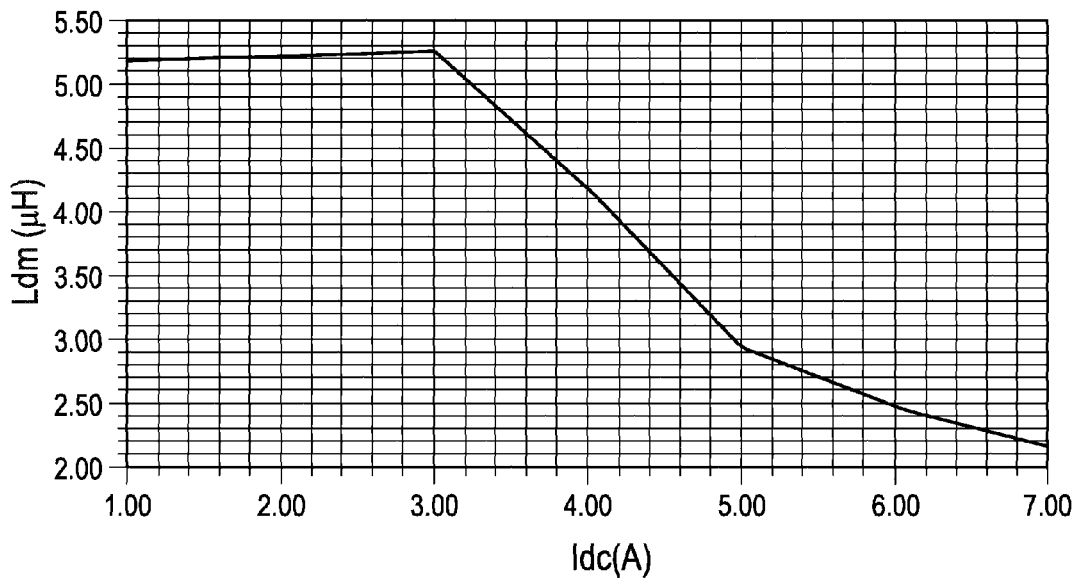
FIGS. 9A-9D are plots showing how the various inductances in the circuit of FIG. 5B vary with increasing load currents.
Figure 9B:
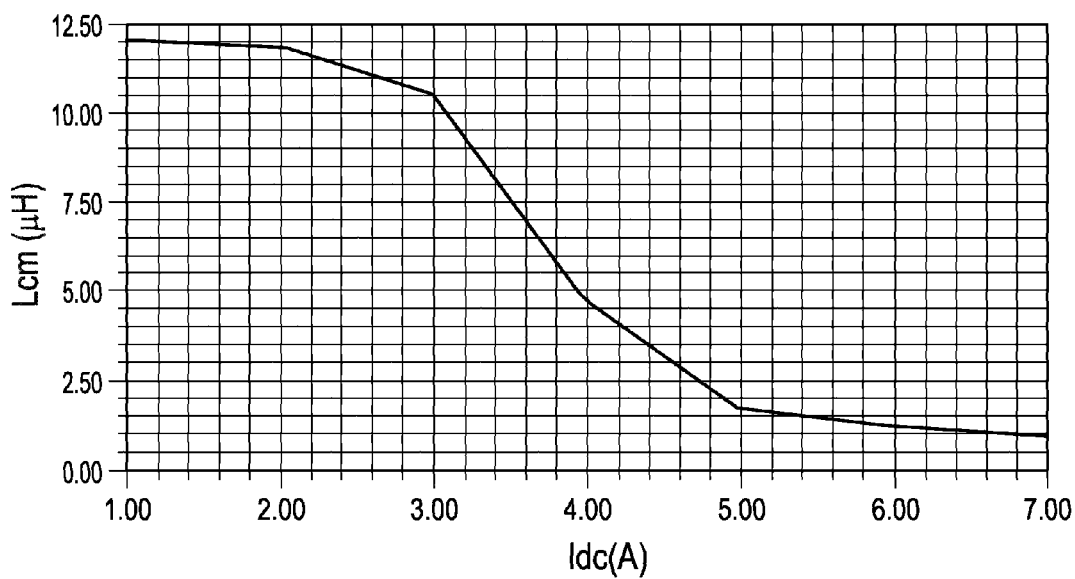
Figure 9C:
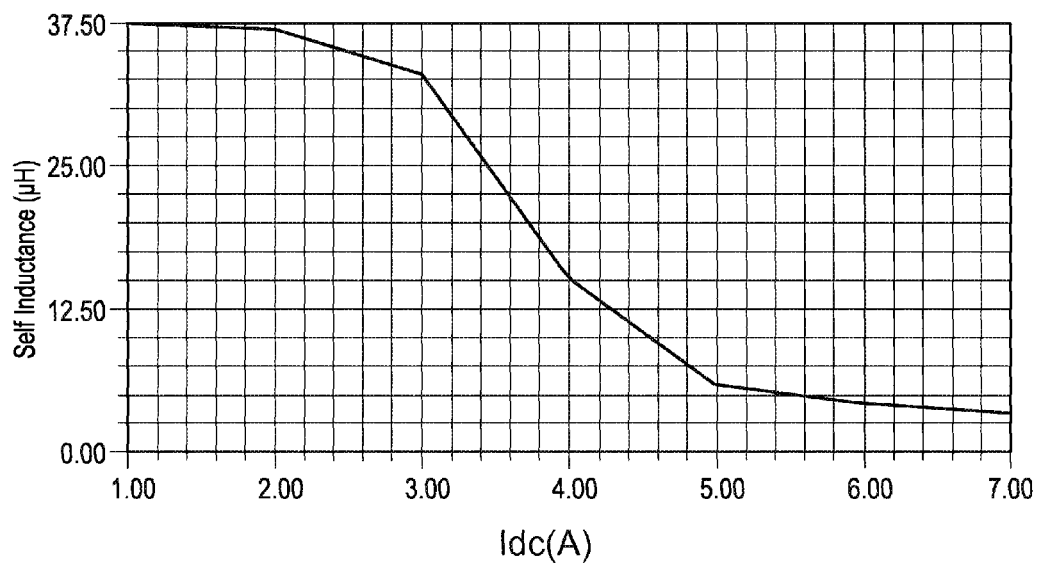
Figure 9D:
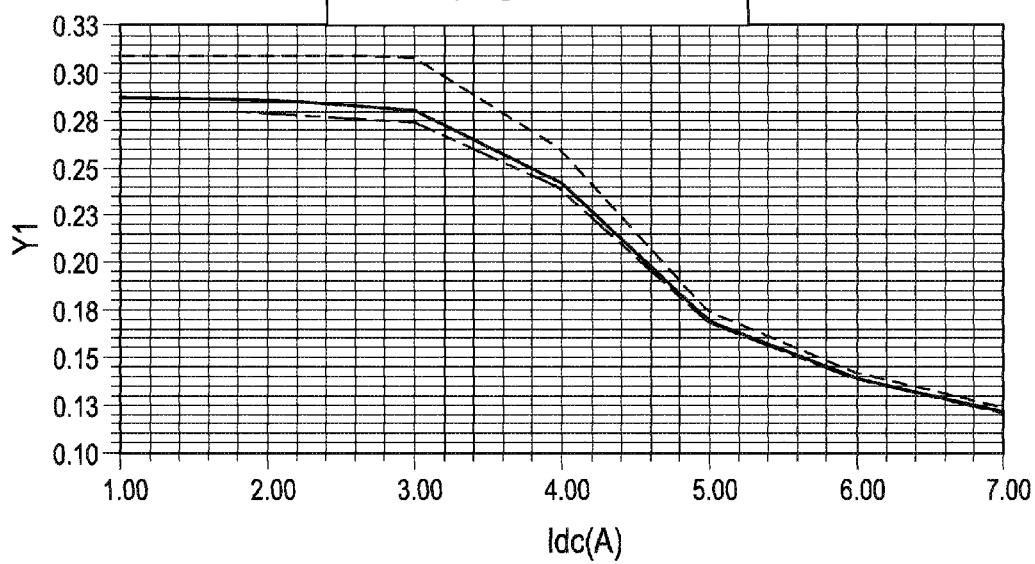

FIGS. 9A-9D show how the various inductances in the circuit of FIG. 5B vary with increasing load currents (or DM1 currents). Higher load currents saturate the core of the inductors causing the inductances to decrease with higher load currents. It is desirable to have a low rate of decrease of the inductances (also referred to as a roll-off rate) as the load current increases. The inductance roll-off characteristic is a function of the material type used in the magnetic structure. FIGS. 9A-9C show the roll-off rates for DM inductance, CM inductance, and self-inductance of the individual inductors, respectively for the filter circuit of FIG. 5B. FIG. 9D shows the roll-off rates for the various mutual inductances in the filter circuit of FIG. 5B. As illustrated by these figures, the variance in the inductances for up to 3.0 A of load current is very small. For load current values above 3.0 A, the inductances reduces gradually. Such gradual roll-off rates are within acceptable limits for most applications, including audio applications, and beneficial in avoiding current peaks of amplifiers.

The filter circuit of FIG. 5B can be designed for various design goals. The results shown in Table 1 below illustrate circuit component values between the filter circuits of FIG. 5A and FIG. 5B. The first row shows the circuit components of FIG. 5A for a given set of operation parameters, and the second, third, and fourth rows illustrate corresponding values when the filter circuit of FIG. 5B is designed to match the ripple current at an idle state (i.e., for substantially zero load current), match the ripple current substantially midway between the idle ripple and the worst ripple, and match the worst case ripple, respectively. The fifth row illustrates the circuit components when the filter circuit of FIG. 5B is designed to match the DM1 inductance of the filter circuit of FIG. 5A. As seen from the results in the fifth row, for substantially similar values of DM1 inductance, the filter circuit of FIG. 5B provides significantly higher DM2 and CM inductances.

TABLE 1

| Row | Filter circuit | L | M | $L_{dm1}$ (µH) | $L_{dm2}$ (µH) | $L_{cm}$ (µH) | $C_{dm}$ (µF) | $C_{cm}$ (µF) | $C_p$ (pF) |
|---|---|---|---|---|---|---|---|---|---|
| 1 | FIG. 5A | 10 | 0 | 10 | 20 | 2.5 | 2.2 | 1 | — |
| 2 | FIG. 5B Idle ripple | 15.2 | 0.29 | 2 | 39 | 4.9 | 13 | 0.6 | 1.15 × 8 |
| 3 | FIG. 5B Mid match | 21.5 | 0.29 | 3 | 55 | 6.9 | 10 | 0.3 | 1.62 × 8 |
| 4 | FIG. 5B Worst ripple | 37.5 | 0.288 | 5 | 97 | 12 | 6 | 0.2 | 2.82 × 8 |
| 5 | FIG. 5B Basic d1 inductance | 67 | 0.28 | 11 | 172 | 21 | 2.2 | 0.1 | 5.85 × 8 |

Table 1 illustrates that for each of the different design goals, the DM1 inductance component ($L_{dm1}$) for the circuit of FIG. 5B is less than that for the filter circuit of FIG. 5A. Because the DM1 component is important in various applications such as audio applications, the reduction in the corresponding inductance translates to smaller inductor requirements for achieving corresponding ripple performance. Table 1 also illustrates that for each of the different design goals, the circuit of FIG. 5B produces a higher DM2 inductance ($L_{dm\_2}$). This results in reduced DM2 currents circulating between the amplifiers, thereby producing smaller ripple currents in the individual inductors.

Table 1 also illustrates that the reduction in inductance requirement comes at the cost of a higher requirement of DM capacitances ($C_{dm}$). However, because the energy storage density for capacitors such as ceramic capacitors are several order of magnitude higher than the energy storage density of inductors, the corresponding increase in capacitor size is significantly less than the corresponding decrease in the inductor sizes. Therefore, the overall filter sizes in FIG. 5B are significantly reduced (as compared to that of FIG. 5A) for substantially same ripple performance. Parasitic capacitance ($C_p$) is larger for bigger core size/bigger copper area (as illustrated by the right-most column of Table 1). However, the parasitic capacitance values are negligible (in the order of pF) as compared to other capacitance values in the circuit (in the order of µF), and do not significantly degrade performance. In some implementations, the parasitic capacitance can be important from the perspective of usable bandwidth of the inductive structure as the parasitic capacitance can govern the self-resonant frequency, which is the upper bound of the usable bandwidth for filtering with a particular design.

A number of implementations have been described. However, other implementations not specifically described in details may also be within the scope of the following claims. For example, even though the example filter structure described in FIGS. 4A-4C support four inductors, structures for higher number of inductors can be implemented without deviating from the scope of the disclosed technology. For example, six or eight inductor filters can be designed using the technology described herein. A six-inductor filter can include, for example, three inductors on the positive side and three inductors on the negative side, and may provide improved harmonic cancellation when implemented with synchronized buck converters with appropriate phase shifts. This is because the effective frequency of switching waveforms increases with increased number of phases. Further, the structure described in FIGS. 4A-4C may also be used for purposes other than those described above. For example, the structure may be used for power conversion applications, or other applications that employ multiple mutually coupled inductors.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. An apparatus comprising:
   at least four magnetic cores, each magnetic core supporting an inductor of a filter circuit, wherein each magnetic core comprises:
      a first section, and
      a second section separated from the first section by an adhesive layer; and an air-core structure to store magnetic energy, the air-core structure comprising:
         a set of focusing projections that define a hollow cavity, wherein individual focusing projections of the set are disposed on different sides of the hollow cavity to focus magnetic fields from the at least four magnetic cores through the hollow cavity,
   wherein each of the inductors corresponding to the at least four magnetic cores comprises a conducting wire wound in a clockwise or anticlockwise direction around a corresponding magnetic core, the direction of winding for at least two inductors being different from the direction of winding of at least two other inductors, and
   wherein the at least four inductors are inductively coupled to one another.

2. The apparatus of claim 1, wherein the at least four magnetic cores and the air-core structure are spatially distributed in the apparatus such that magnetic flux in a differential mode from each of the at least four magnetic cores passes through the hollow cavity.

3. The apparatus of claim 1, wherein the at least four magnetic cores and the air-core structure are spatially distributed within the apparatus such that in a common mode, a total magnetic flux passing through the hollow cavity is substantially zero.

4. An apparatus comprising:
   at least four magnetic cores, each magnetic core supporting an inductor of a filter circuit, and wherein each magnetic core comprises:
      a first section, and
      a second section separated from the first section by an adhesive layer; and
   an air-core structure to store magnetic energy, the air-core structure comprising:
   a set of focusing projections that define a hollow cavity, wherein individual focusing projections of the set are disposed on different sides of the hollow cavity to focus magnetic fields from the at least four magnetic cores through the hollow cavity,
   wherein the filter circuit is disposed between an amplifier circuit and a load that is drivable by the amplifier circuit from two sides of the load, and
   wherein multiple outputs of the amplifier circuit are interleaved.

5. The apparatus of claim 4, wherein the filter circuit is operable in a common mode and at least one differential mode.

6. The apparatus of claim 4, wherein the load is a bridge-tied load.

7. The apparatus of claim 4, wherein the amplifier circuit comprises at least four buck converters, an output of each buck converter being connected to a corresponding inductor.

8. An apparatus comprising:
   an amplifier circuit comprising at least four amplifiers;
   a load driven by the amplifier circuit from two sides of the load; and
   a filter circuit comprising:
      at least four inductors that are inductively coupled with one another, each of the inductors comprising a conductor wire wound around a core of magnetic material in a clockwise or anticlockwise direction, the direction of winding for at least two inductors being different from the direction of winding of at least two other inductors,
      a set of focusing projections defining a hollow cavity that stores magnetic energy when subjected to a magnetic flux,
      at least four input terminals, each input terminal for connecting a corresponding one of the at least four inductors to one of the at least four amplifiers; and
      at least two output terminals for connecting the filter circuit to the load.

9. The apparatus of claim 8, wherein each of the at least four amplifiers comprises a buck converter.

10. The apparatus of claim 8, wherein the load comprises a bridge-tied load.

11. The apparatus of claim 10, wherein the at least two output terminals of the filter circuit are connected to two terminals of the bridge-tied load.

12. The apparatus of claim 8, wherein outputs of the at least four amplifiers are interleaved.

13. The apparatus of claim 8, wherein the at least four inductors comprise six inductors or eight inductors.

14. A filter circuit comprising:
   at least four inductors that are inductively coupled with one another, each of the inductors comprising a conductor wire wound around a core of magnetic material in a clockwise or anticlockwise direction, a direction of winding for at least two inductors being different from a direction of winding of at least two other inductors;
   a set of focusing projections defining a hollow cavity that stores magnetic energy when subjected to a magnetic flux;
   at least four input terminals, each input terminal connected to an output of an amplifier corresponding to one of the at least four inductors; and
   at least two output terminals for connecting the filter circuit to a load driven from two sides of the load by the amplifiers corresponding to the at least four inductors.

15. The filter circuit of claim 14 wherein the filter circuit is operable in a common mode and at least one differential mode.

16. The filter circuit of claim 15, wherein a common mode inductance of the filter circuit is at least 1.5 times higher than a differential mode inductance for the at least one differential mode.

17. The filter circuit of claim 14, wherein the at least four inductors and the hollow cavity are spatially distributed such that in a common mode, a total magnetic field passing through the hollow cavity is substantially zero.

18. The filter circuit of claim 14, wherein the outputs of the at least four amplifiers are interleaved.

19. The filter circuit of claim 14, wherein (i) the magnetic cores supporting the at least four inductors, and (ii) the hollow cavity are within a structure comprising the magnetic material.

20. The filter circuit of claim 19, wherein individual focusing projections of the set of focusing projections are disposed on opposite sides of the hollow cavity to focus magnetic fields from the at least four magnetic cores through the hollow cavity.

21. The filter circuit of claim 14, wherein a cross-sectional area of the hollow cavity is substantially equal to sum of cross-sectional areas of the at least four magnetic cores.

22. The filter circuit of claim 14, wherein a first set of at least two inductors of the at least four inductors has a clockwise direction of winding and is connected to one of the at least two output terminals, and a second set of at least two inductors, of the at least four inductors different from the first set of at least two inductors, has an anticlockwise direction of winding and is connected to another of the at least two output terminals.

23. An apparatus comprising:
at least four magnetic cores, each magnetic core supporting an inductor of a filter circuit, wherein each magnetic core comprises:
a first section, and
a second section separated from the first section by an adhesive layer; and
an air-core structure to store magnetic energy, the air-core structure comprising:
a set of focusing projections that define a hollow cavity, wherein individual focusing projections of the set are disposed on different sides of the hollow cavity to focus magnetic fields from the at least four magnetic cores through the hollow cavity,
wherein a cross-sectional area of the hollow cavity is substantially equal to a sum of cross-sectional areas of the at least four magnetic cores such that flux distribution in the apparatus is uniform.

\* \* \* \* \*